United States Patent
Lee et al.

(10) Patent No.: US 11,575,026 B2
(45) Date of Patent: Feb. 7, 2023

(54) SOURCE/DRAIN STRUCTURE FOR SEMICONDUCTOR DEVICE

(71) Applicant: Taiwan Semiconductor Manufacturing Co., Ltd., Hsinchu (TW)

(72) Inventors: Chien-Wei Lee, Kaohsiung (TW); Chii-Horng Li, Zhubei (TW); Heng-Wen Ting, Hsinchu (TW); Yee-Chia Yeo, Hsinchu (TW); Yen-Ru Lee, Hsinchu (TW); Chih-Yun Chin, Taichung (TW); Chih-Hung Nien, Changhua (TW); Jing-Yi Yan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 17/207,359

(22) Filed: Mar. 19, 2021

(65) Prior Publication Data
US 2022/0302281 A1   Sep. 22, 2022

(51) Int. Cl.
| H01L 29/66 | (2006.01) |
| H01L 29/45 | (2006.01) |
| H01L 29/08 | (2006.01) |
| H01L 29/78 | (2006.01) |
| H01L 29/167 | (2006.01) |
| H01L 21/02 | (2006.01) |
| H01L 29/40 | (2006.01) |
| H01L 21/225 | (2006.01) |
| H01L 21/8234 | (2006.01) |
| H01L 29/417 | (2006.01) |

(52) U.S. Cl.
CPC .... *H01L 29/66795* (2013.01); *H01L 21/0262* (2013.01); *H01L 21/02532* (2013.01); *H01L 21/02579* (2013.01); *H01L 21/2257* (2013.01); *H01L 21/823418* (2013.01); *H01L 29/0847* (2013.01); *H01L 29/167* (2013.01); *H01L 29/401* (2013.01); *H01L 29/45* (2013.01); *H01L 29/785* (2013.01); *H01L 29/41791* (2013.01)

(58) Field of Classification Search
CPC ................. H01L 21/823418; H01L 29/45
See application file for complete search history.

(56) References Cited

U.S. PATENT DOCUMENTS

| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |

(Continued)

*Primary Examiner* — Farun Lu
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a fin structure over the substrate, a gate structure over the fin structure, an epitaxial region formed in the fin structure and adjacent to the gate structure. The epitaxial region can embed a plurality of clusters of dopants.

20 Claims, 12 Drawing Sheets

(56) References Cited

U.S. PATENT DOCUMENTS

| | | | |
|---|---|---|---|
| 9,608,116 B2 | 3/2017 | Ching et al. | |
| 10,483,396 B1* | 11/2019 | Chin | H01L 29/66795 |
| 2015/0206946 A1* | 7/2015 | Chen | H01L 29/0847 |
| | | | 438/300 |

* cited by examiner

SOURCE/DRAIN STRUCTURE FOR SEMICONDUCTOR DEVICE

BACKGROUND

Advances in semiconductor technology has increased the demand for transistors with higher performance for faster processing systems. To meet this demand, it is important to reduce the transistor's contact resistance to minimize the transistor delay (e.g., RC delay). Heavily doped source/drain terminals can reduce the transistor's contact resistance, thus increasing transistor speed.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
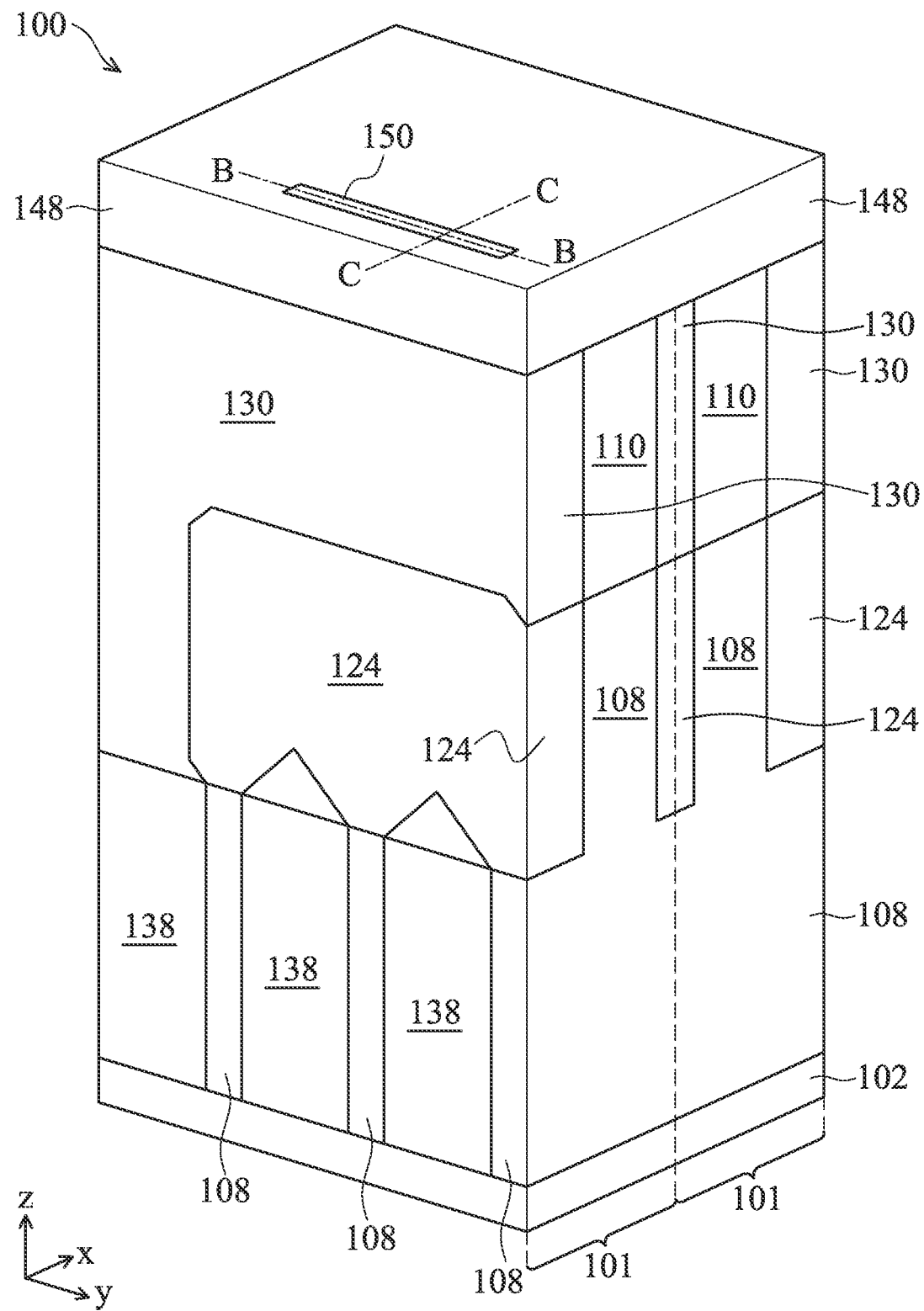
FIG. 1A is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another elements) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A dopant is an impurity element that can be introduced to a semiconductor material to modulate the resistivity of the semiconductor material. For example, the dopant can be doped into the semiconductor material's lattice structure as donors or acceptors to lower the semiconductor material's resistivity. However, due to the dopant's limited solid solubility in the semiconductor material, an amount of dopants that can be doped in the semiconductor material is limited, thus resulting in insufficient donors or acceptors in the semiconductor material to effectively lower contact resistance in an integrated circuit (IC).

To address the aforementioned challenges, this disclosure is directed to a fabrication method and structures that provide clusters of a dopant embedded in source/drain (S/D) regions of a transistor. For example, the S/D regions can include a doped epitaxial stack. The epitaxial region can further include the clusters of the dopant to reduce the S/D contact resistance of the transistor. In some embodiments, the epitaxial stack can include a first epitaxial layer doped with the dopant of a first concentration, and a second epitaxial layer, formed over the first epitaxial layer, doped with the dopant of a second concentration greater than the first concentration. The second epitaxial layer can further include the clusters of the dopant to lower the S/D contact resistance. In some embodiments, the epitaxial stack can include multilayers of the silicon germanium (SiGe) layers.

In some embodiments, the dopant, can include boron; thus, clusters of boron can be formed embedded in the S/D region. A benefit of the present disclosure, among other, is to provide S/D regions with low contact resistance, thus improving transistor performance (e.g., speed).

Figure 1B:
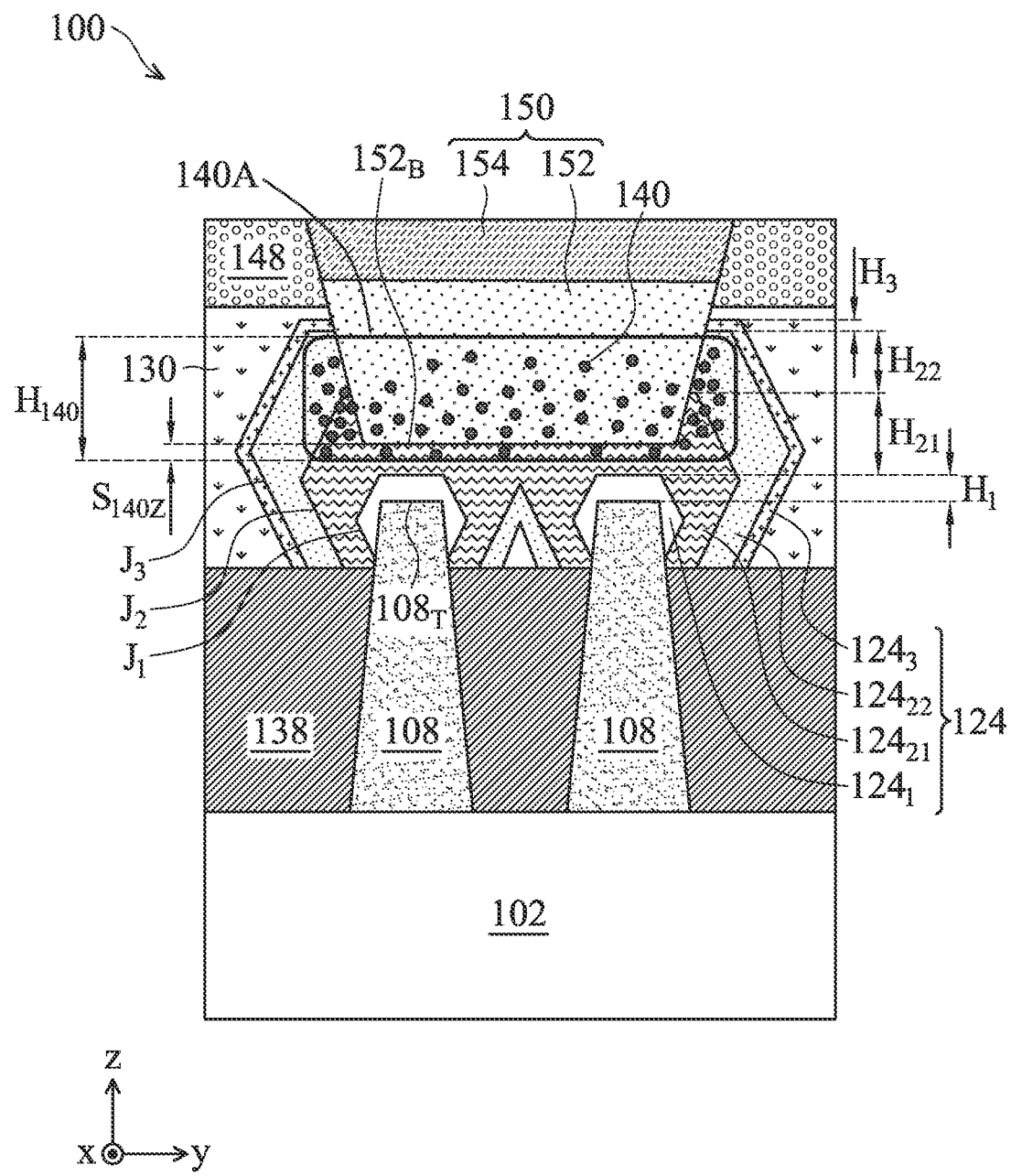
FIGS. 1B and 1C are cross-sectional views of a semiconductor device, according to some embodiments.
Figure 1C:
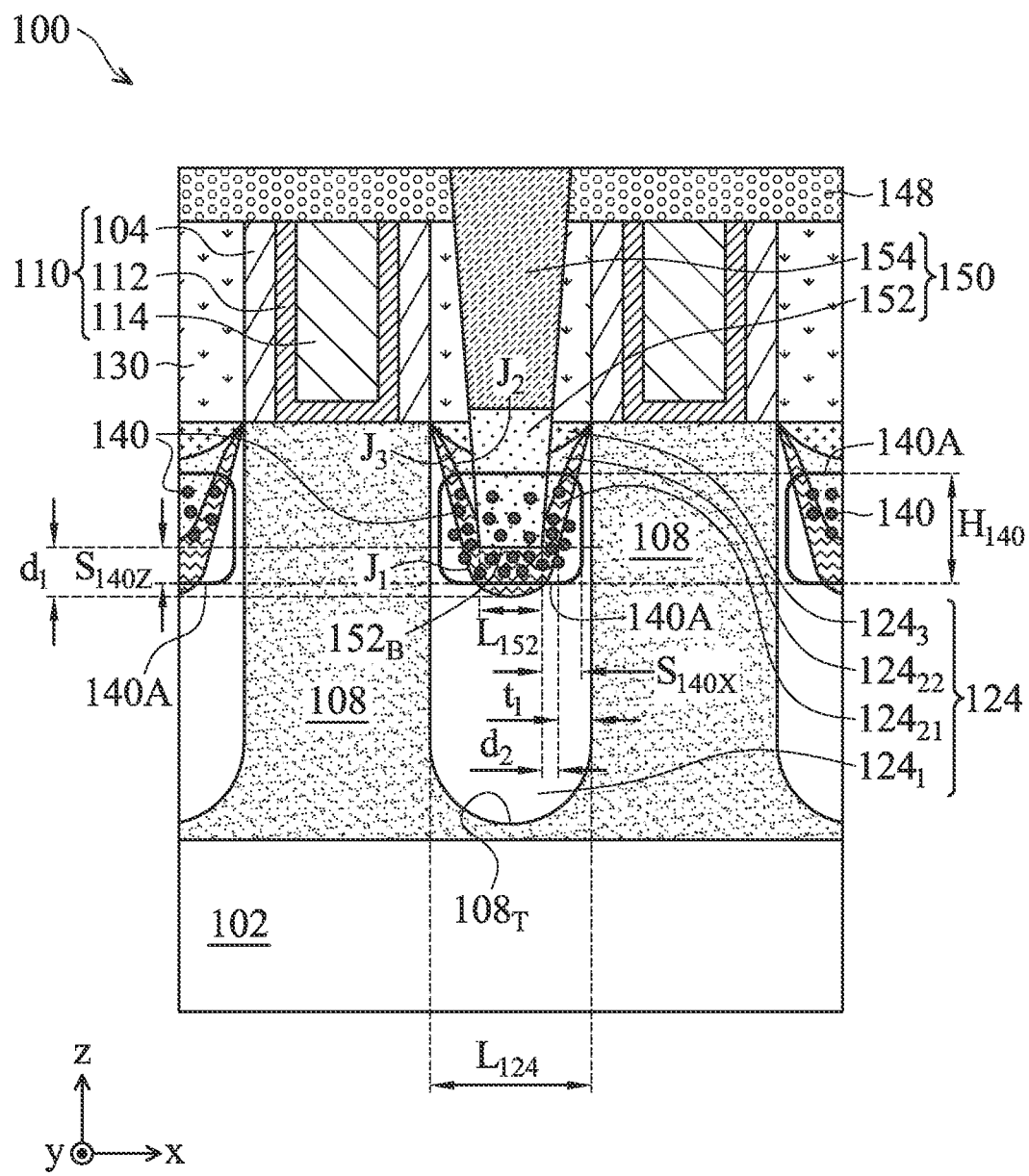

A semiconductor device 100 having multiple FETs 101 formed over a substrate 102 is described with reference to FIGS. 1A-1C, according to some embodiments. FIG. 1A illustrates an isometric view of semiconductor device 100, according to some embodiments. FIG. 1B illustrates a cross-sectional view along a source/drain (S/D) region (e.g., line B-B of FIG. 1A) of semiconductor device 100, according to some embodiments. FIG. 1C illustrates a cross-sectional view along a channel direction (e.g., line C-C of FIG. 1A) of semiconductor device 100, according to some embodiments. The discussion of elements in FIGS. 1A-1C with the same annotations applies to each other, unless mentioned otherwise. Semiconductor device 100 can be included in a microprocessor, memory cell, or other integrated circuit (IC). Also, even though each FET 101 shown in FIGS. 1A-1C is a fin field effect transistor (finFET), each FET 101 can be a gate-all-around (GAA) FET, according to some embodiments.

Referring to FIG. 1A, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

Each FET 101 can include a fin structure 108 extending along an x-axis, a gate structure 110 traversing through fin structure 108 along an y-axis, and S/D regions 124 formed over portions of fin structure 108. Although FIG. 1A shows each fin structure 108 accommodating two FETs 101, any number of FETs 101 can be disposed along each fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction). In some embodiments, multiple FETs 101 can have a common gate structure 110.

Each fin structure 108 can be formed over substrate 102 and can include a material similar to substrate 102. In some embodiments, fin structure 108 can include a material having a lattice constant substantially equal to (e.g., lattice mismatch within 5%) that of substrate 102. In some embodiments, fin structure 108 can include a material identical to substrate 102. In some embodiments, fin structure 108 can include multiple channel layers under gate structure 110, each made of identical or different materials from each other. Fin structure 108 can be p-type doped, n-type doped, or un-doped. In some embodiments, a portion of fin structure 108 wrapped by gate structure 110 and another portion of fin structure 108 adjacent to gate structure 110 can be doped differently.

Semiconductor device 100 can further include shallow trench isolation (STI) regions 138 configured to provide electrical isolation between fin structures 108. Also, STI regions 138 can provide electrical isolation between FETs 101 and neighboring active and passive elements (not shown in FIG. 1A) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A and 1C, gate structure 110 can be multi-layered structures that wraps around portions of one or more fin structures 108 to modulate FET 101. In some embodiments, gate structure 110 can be referred to as gate-all-around (GAA) structures, where FET 101 can be referred to as a GAA FET 101. Gate structure 110 can include a gate dielectric layer 112, a gate electrode 114 disposed on dielectric layer 112, and gate spacers 104 disposed on sidewalk of gate electrode 114.

Gate dielectric layer 112 can be wrapped around portions of fin structure 108 and can be further disposed between gate electrode 114 and S/D regions 124 to prevent an electrical short in between. Gate dielectric layer 112 can include any suitable dielectric material with any suitable thickness that can provide channel modulation for FET 101. In some embodiments, gate dielectric layer 112 can include silicon oxide and a high-k dielectric material (e.g., hafnium oxide or aluminum oxide), and gate dielectric layer 112 can have a thickness ranging from about 1 nm to about 5 nm. Other materials and thicknesses for gate dielectric layer 112 are within the scope and spirit of this disclosure.

Gate electrode 114 can function as a gate terminal for FET 101. Gate electrode 114 can include a metal stack wrapping around portions of fin structure 108. Gate electrode 114 can include any suitable conductive material that provides a suitable work function to modulate FET 101. In some embodiments, gate electrode 114 can include titanium nitride, tantalum nitride, tungsten nitride, titanium, aluminum, copper, tungsten, tantalum, or nickel (Ni). Other materials for gate electrode 114 are within the scope and spirit of this disclosure.

Gate spacer 104 can be in physical contact with gate dielectric layers 112, according to some embodiments. Gate spacer 104 can have a low-k material with a dielectric constant less than about 3.9. For example, gate spacer 104 can include insulating material, such as silicon oxide, silicon nitride, a low-k material, and a combination thereof. In some embodiments, gate spacer 104 can have a thickness ranging from about 2 nm to about 10 nm. Other materials and thicknesses for gate spacer 104 are within the scope and spirit of this disclosure.

Each FET 101 can have S/D regions 124 formed at opposite sides (e.g., along x-direction) of gate structure 110. Each S/D region 124 can include an epitaxially-grown semiconductor material that embeds dopant clusters 140. In some embodiments, S/D region 124 can further include dopant clusters 140 embedded in the epitaxially-grown semiconductor material. In some embodiments, the epitaxially grown semiconductor material can be the same material as the material of substrate 102. In some embodiments, the epitaxially-grown semiconductor material can have a lattice constant substantially equal to (e.g., lattice mismatch within 5%) that of the material of substrate 102. In some embodiments, the epitaxially-grown semiconductor material can include (i) a semiconductor material, such as Ge and Si; (ii) a compound semiconductor material, such as GaAs and AlGaAs; or (iii) a semiconductor alloy, such as SiGe and GaAsP. The epitaxially-grown semiconductor material of S/D region 124 can be doped with p-type dopants, n-type dopants, or intrinsic dopants. In some embodiments, the doped p-type dopants, the doped n-type dopants, or the doped intrinsic dopants can be respectively incorporated to occupy S/D region 124's lattice sites, where each of the doped p-type dopants, the doped n-type dopants, or the doped intrinsic dopants can be proximate to S/D region 124's atoms. In some embodiments, the p-type dopants can include boron, indium, aluminum, gallium, zinc, beryllium, or magnesium. In some embodiments, the n-type dopants can include phosphorus, arsenic, sulfur, or selenium. In some embodiments, the intrinsic dopants can include iron or chromium. In some embodiments, S/D regions 124 formed at different FETs 101 can have different materials and/or doping types from each other.

Referring to FIGS. 1B and 1C, S/D region 124 can be a layer stack of epitaxially-grown semiconductor material. For example, S/D region can include a first layer $124_1$ formed over fin structure 108. For example, first layer $124_1$ can be formed over a top surface $108_T$ of portions of fin structure 108 that are laterally (e.g., in the x-direction) outside gate structure 110. First layer $124_1$ can have a vertical thickness $H_1$ measured from top surface $108_T$. In some embodiments, vertical thickness $H_1$ can be from about 8 nm to about 40 nm, from 12 nm to about 40 nm, from about 12 nm to about 30 nm, or from about 12 nm to about 16 nm to form dopant clusters 140 in S/D region 124, as achieved by method 200 (discussed below). If vertical thickness $H_1$ is below the above-noted lower limits, the separation between silicide layer 152 (discussed below) and first layer $124_1$ can be increased to degrade the driving force for forming dopant clusters 140 in S/D region 124 (discussed below in method 200). If vertical thickness $H_1$ is beyond the above-noted upper limits, the volume of second layer $124_{21}$ (discussed below) can be reduced to degrade the stress for enhancing FET 101's channel mobility. In some embodiments, vertical thickness $H_1$ can be greater than about 8 nm, greater than about 15 nm, greater than about 20 nm, greater than about 25 nm, greater than about 30 nm, or greater than about 40 nm to form dopant clusters 140 in S/D region 124, as achieved by method 200 (discussed below). If vertical thickness $H_1$ is below the above-noted lower limits, the separation between silicide layer 152 (discussed below) and first layer $124_1$ can be increased to degrade the driving force for forming dopant clusters 140 in S/D region 124 (discussed below in method 200). In some embodiments, S/D region 124 can have a length $L_{124}$ (e.g., in the x-direction) parallel to fin structure 108, where a ratio of vertical thickness $H_1$ to length $L_{124}$ can be from about 0.1 to about 0.9, such as from about 0.1 to about 0.7, from about 0.1 to about 0.6, from about 0.3 to about 0.6, and from about 0.3 to about 0.5, to form dopant dusters 140 in S/D region 124. If the ratio of vertical thickness to length $L_{124}$ is below the above-noted lower limits, the separation between silicide layer 152 (discussed below) and first layer $124_1$ can be increased to degrade the driving force for forming dopant clusters 140 in S/D region 124 (discussed below in method 200). If the ratio of vertical thickness $H_1$ to length $L_{124}$ is beyond the above-noted upper limits, the volume of second layer $124_{21}$ (discussed below) can be reduced to degrade the stress for enhancing FET 101's channel mobility. In some embodiments, first layer $124_1$ can be made of a compound semiconductor, such as SiGe. In some embodiments, first layer $124_1$ can be made of SiGe with the atomic concentration of germanium less than about 35% to form dopant clusters 140 in S/D region 124. If the atomic concentration of germanium of first layer $124_1$ is beyond the above-noted upper limit, first layer $124_1$ may not provide sufficient host material (e.g., silicon) to form silicide 152 proximate to first layer $124_1$, thus degrading the driving force for forming dopant clusters 140 in S/D region 124 (discussed below in method 200). In some embodiments, first layer $124_1$ can be made of SiGe with the atomic concentration of germanium from about 10% to about 35%, from about 10% to about 25%, or from about 10% to about 15% to form dopant clusters 140 in S/D region 124. If the atomic concentration of germanium of first layer $124_1$ is beyond the above-noted upper limits, first layer $124_1$ may not provide sufficient host material (e.g., silicon) to form silicide 152 proximate to first layer $124_1$, thus degrading the driving force for forming dopant clusters 140 in S/D region 124 (discussed below in method 200). If the atomic concentration of germanium of first layer $124_1$ is below the above-noted lower limits, first layer $124_1$ may not reconcile lattice mismatches between second layer $124_{21}$ and substrate 102, thus forming crystal defects (e.g., dislocations) in S/D region 124. In some embodiments, first layer $124_1$ can include SiGe with the atomic concentration of germanium gradually increasing along a vertical direction (e.g., in the z-direction) away from top surface $108_T$.

In some embodiments, first layer $124_1$ can be doped with p-type dopants, such as boron, indium, aluminum, gallium, zinc, beryllium, and magnesium. In some embodiments, first layer $124_1$ can be doped with p-type dopants having a concentration less than $5 \times 10^{20}/cm^3$, such as from about $1 \times 10^{18}/cm^3$ to about $5 \times 10^{20}/cm^3$, from about $1 \times 10^{19}/cm^3$ to about $5 \times 10^{20}/cm^3$ or from about $1 \times 10^{19}/cm^3$ to about $3 \times 10^{10}/cm^3$. If first layer $124_1$'s dopant concentration is beyond the above-noted upper limit, FET 101 can be susceptible to the short channel effect. If first layer $124_1$'s dopant concentration is below the above-noted lower limits, FET 101 may have a higher contact resistance. In some embodiments, first layer $124_1$ can be doped with p-type dopants having a concentration gradually increasing along a vertical direction (e.g., in the z-direction) away from top surface $108_T$. In some embodiments, first layer $124_1$ can be doped with n-type dopants, such as phosphorus and arsenic, or intrinsic dopants, such as iron and chromium.

S/D region 124 can further include a second layer $124_{21}$ formed over first layer $124_1$. In some embodiments, second layer $124_{21}$ can contact first layer $124_1$ along a junction $J_1$. Second layer $124_{21}$ can have a vertical thickness $H_{21}$ measured from portions of junction $J_1$ that are laterally (e.g., in the x-y plane) in the perimeter of top surface $108_T$. In some embodiments, a ratio of vertical thickness $H_{21}$ to length $L_{124}$ can be less than about 0.8, less than about 0.7, less than about 0.5, less than about 0.3, or less than about 0.2 to form dopant clusters 140 in S/D region 124, otherwise the separation between silicide layer 152 (discussed below) and the underlying first layer $124_1$ can be increased to degrade the driving force for forming dopant clusters 140 in S/D region 124 (discussed below in method 200). In some embodiments, a ratio of vertical thickness $H_{21}$ to first layer $124_1$'s vertical thickness $H_1$ can be less than about 20, less than about 15, less than about 10, less than about 5, less than about 3, or less than about 1 to form dopant clusters 140 in S/D region 124. If the ratio of vertical thickness $H_{21}$ to length $L_{124}$ is beyond the above-noted upper limits, the separation between silicide layer 152 (discussed below) and the underlying first layer $124_1$ can be increased to degrade the driving force for forming dopant clusters 140 in S/D region 124 (discussed below in method 200). Second layer $124_{21}$ can be made of a compound semiconductor, such as SiGe. In some embodiments, first and second layers $124_1$ and $124_{21}$ can be made of SiGe, where second layer $124_{21}$ can have a greater atomic concentration of germanium than first layer $124_1$ to provide a sufficient stress to enhance FET 101's channel mobility. For example, second layer $124_{21}$ can be made of SiGe with the atomic concentration of germanium from about 35% to about 60%. In some embodiments, second layer $124_{21}$ can include SiGe with the atomic concentration of germanium gradually increasing along a vertical direction (e.g., in the z-direction) away from junction $J_1$.

In some embodiments, second layer $124_{21}$ can be doped with p-type dopants, such as boron, indium, aluminum, gallium, zinc, beryllium, and magnesium. Second layer $124_{21}$ can be doped having a greater concentration than first layer $124_1$ to lower FET 101's contact resistance. For example, first and second layers $124_1$ and $124_{21}$ can be made of SiGe doped with boron, where the boron concentration doped in second layer $124_{21}$ can be greater than that in first layer $124_1$. In some embodiments, second layer $124_{21}$ can be doped with p-type dopants having a concentration close to the solid solubility of the p-type dopants in second layer $124_{21}$, thus providing a condition that favors forming dopant clusters 140 of the p-type dopants in S/D region 124, as achieved by method 200 (discussed below). For example, boron's solid solubility in SiGe can be substantially equal to or greater than about $1 \times 10^{21}/cm^3$. Accordingly, second layer $124_{21}$ can be made of SiGe doped with boron having a concentration substantially equal to or greater than about $1 \times 10^{21}/cm^3$, such as greater than about $2 \times 10^{21}/cm^3$, greater than about $3 \times 10^{21}/cm^3$, greater than about $3.5 \times 10^{21}/cm^3$, and greater than about $4 \times 10^{21}/cm^3$, to form dopant clusters 140 of boron. If second layer $124_{21}$ is doped with the p-type dopant (e.g., boron) having a concentration below the above-noted lower limits, the driving force provided by suicide layer 152 may not precipitate the p-type dopant (e.g., boron) doped in second layer $124_{21}$ to form dopant clusters 140 in S/D region 124. In some embodiments, second layer $124_{21}$ can be made of SiGe doped with boron having a concentration from about $5 \times 10^{20}/cm^3$ to about $6 \times 10^{21}/cm^3$, from about $8 \times 10^{20}/cm^3$ to about $6 \times 10^{21}/cm^3$, from about $1 \times 10^{21}/cm^3$ to about $6 \times 10^{21}/cm^3$, from about $2 \times 10^{21}/cm^3$ to about $6 \times 10^{21}/cm^3$, from about $3 \times 10^{21}/cm^3$ to about $6 \times 10^{21}/cm^3$, or from about $4 \times 10^{21}/cm^3$ to about $6 \times 10^{21}/cm^3$ to form dopant clusters 140 of boron achieved by method 200 (discussed below). If second layer $124_{21}$ is doped with the p-type dopant (e.g., boron) having a concentration below the above-noted lower limits, the driving force provided by silicide layer 152 may not precipitate the p-type dopant (e.g., boron) doped in second layer $124_{21}$ to form dopant clusters 140 in S/D region 124. Further, the above-noted upper limit of the p-type dopant (e.g., boron) concentration may be limited or determined by the p-type dopant's solid solubility in second layer $124_{21}$, according to some embodiments. In some embodiments, second layer $124_{21}$ can be doped with p-type dopants having a concentration gradually increasing along a vertical direction (e.g., in the z-direction) away from junction $J_1$. In some embodiments, second layer $124_{21}$ can be doped with n-type dopants such as phosphorus and arsenic, or intrinsic dopants, such as iron and chromium.

S/D region 124 can further include a third layer $124_{22}$ formed over second layer $124_{21}$. In some embodiments, third layer $124_{22}$ can contact second layer $124_{21}$ along a junction $J_2$. Third layer $124_{22}$ can have a vertical thickness $H_{22}$ measured from portions of junction $J_2$ that are laterally (e.g., in the x-y plane) in the perimeter of top surface $108_T$. In some embodiments, a ratio of vertical thickness $H_{22}$ to length $L_{124}$ can be less than about 0.5, less than about 0.3, less than about 0.1, less than about 0.08, less than about 0.06, or less than about 0.05 to form dopant clusters 140 achieved by method 200 (discussed below). If the ratio of vertical thickness $H_{22}$ to length $L_{124}$ is beyond the above-noted upper limits, the separation between silicide layer 152 (discussed below) and the underlying first layer $124_1$ can be increased to degrade the driving force for forming dopant clusters 140 in S/D region 124 (discussed below in method 200). In some embodiments, a ratio of vertical thickness $H_1$ to vertical thickness $H_{22}$ can be greater than about 0.5, greater than about 1, greater than about 2, greater than about 2.5, greater than about 3, or greater than about 4 to form dopant clusters 140 in S/D region 124. If the ratio of vertical thickness $H_1$ to vertical thickness $H_{22}$ is below the above-noted lower limits, first layer $124_1$ may not provide sufficient host material (e.g., silicon) to form silicide 152 proximate to first layer $124_1$, thus degrading the driving force for forming dopant clusters 140 in S/D region 124 (discussed below in method 200). Third layer $124_{22}$ can be made of a compound semiconductor, such as SiGe. In some embodiments, second and third layers $124_{21}$ and $124_{22}$ can be made of SiGe, where third layer $124_{22}$ can have an atomic concentration of germanium greater than or substantially equal to second layer $124_{21}$ to provide sufficient stress to enhance FET 101's channel mobility. For example, second layer $124_{21}$ can be made of SiGe with the atomic concentration of germanium from about 35% to about 60%, and third layer $124_{22}$ can be made of SiGe with the atomic concentration of germanium of about 60%. In some embodiments, third layer $124_{22}$ can include SiGe with the atomic concentration of germanium substantially constant along a vertical direction (e.g., in the z-direction) away from junction $J_2$. In some embodiments, second and third layer $124_{21}$ and $124_{22}$ can include SiGe with the atomic concentration of germanium gradually increasing along a vertical direction (e.g., in the z-direction) away from junction $J_2$, where third layer $124_{22}$ can have a narrower range of the atomic concentration of germanium than second layer $124_{21}$. For example, second layer $124_{21}$ can include SiGe with the atomic concentration of germanium increasing from about 40% proximate to junction $J_1$ to about 55% away from junction $J_1$, where third layer $124_{22}$ can include SiGe with the atomic concentration of germanium increasing from about 55% proximate to junction $J_2$ to about 60% away from junction $J_2$.

In some embodiments, third layer $124_{22}$ can be doped with p-type dopants, such as boron, indium, aluminum, gallium, zinc, beryllium, and magnesium. Third layer $124_{22}$ can be doped having a substantially equal or a greater concentration than second layer $124_{21}$. For example, second and third layers $124_{91}$ and $124_{22}$ can be made of SiGe doped with boron, where the boron concentration doped in third layer $124_{22}$ can be a substantially equal to or a greater than that in second layer $124_{21}$ to lower FET 101's contact resistance. In some embodiments, third layer $124_{22}$ can be doped with p-type dopants having a concentration close to the solid solubility of the p-type dopants in third layer $124_{22}$, thus providing a condition that favors forming dopant clusters 140 of the p-type dopants in S/D region 124, as achieved by method 200 (discussed below). For example, as previously discussed, boron's solid solubility in SiGe can be substantially equal to or greater than about $1\times10^{21}/cm^3$. Accordingly, third layer $124_{22}$ can be made of SiGe doped with boron having a concentration substantially equal to or greater than about $1\times10^{21}/cm^3$, such as greater than about $2\times10^{21}/cm^3$, greater than about $3\times10^{21}/cm^3$, greater than about $3.5\times10^{21}/cm^3$, and greater than about $4\times10^{21}/cm^3$, to form dopant clusters 140 of boron in S/D region 124. If third layer $124_{22}$ is doped with the p-type dopant (e.g., boron) having a concentration below the above-noted lower limits, the driving force provided by silicide layer 152 may not precipitate the p-type dopant (e.g., boron) doped in third layer $124_{22}$, to form dopant clusters 140 in S/D region 124. In some embodiments, third layer $124_{22}$ can be doped with boron having a concentration from about $5\times10^{20}/cm^3$ to about $6\times10^{21}/cm^3$, from about $8\times10^{20}/cm^3$ to about $6\times10^{21}/cm^3$, from about $1\times10^{21}/cm^3$ to about $6\times10^{21}/cm^3$, from about $2\times10^{21}/cm^3$ to about $6\times10^{21}/cm^3$, from about $3\times10^{21}/cm^3$ to about $6\times10^{21}/cm^3$, or from about $4\times10^{21}/cm^3$ to about $6\times10^{21}/cm^3$ to form dopant clusters 140 of boron in S/D region 124. If third layer $124_{22}$ is doped with the p-type dopant (e.g., boron) having a concentration below the above-noted lower limits, the driving force provided by silicide layer 152 may not precipitate the p-type dopant (e.g., boron) doped in third layer $124_{22}$ to form dopant clusters 140 in S/D region 124. The above-noted upper limit of p-type dopant (e.g., boron) concentration may be limited or determined by the p-type dopant's solid solubility in third layer $124_{22}$, according to some embodiments. In some embodiments, third layer $124_{22}$ can be doped with p-type dopants having a concentration gradually increasing along a vertical direction (e.g., in the z-direction) away from junction $J_2$. In some embodiments, third layer $124_{22}$ can be doped with p-type dopants having a concentration substantially constant along a vertical direction (e.g., in the z-direction) away from junction $J_2$. In some embodiments, third layer $124_{22}$ can be doped with n-type dopants, such as phosphorus and arsenic, or intrinsic dopants, such as iron and chromium.

S/D region 124 can further include a capping layer $124_3$ formed over third layer $124_{22}$. In some embodiments, capping layer $124_3$ can contact third layer $124_{22}$ along a junction $J_3$. Capping layer $124_3$ can have a vertical thickness $H_3$ measured from portions of junction $J_3$ that are laterally (e.g., in the x-y plane) in the perimeter of top surface $108_T$. In some embodiments, vertical thickness $H_3$ can be from greater than about 2 nm, such as greater than about 5 nm, greater than about 10 nm, greater than about 20 nm, and greater than about 30 nm, to form dopant clusters 140 in S/D region 124, as achieved by method 200 (discussed below). If vertical thickness $H_3$ is below the above-noted lower limits, capping layer $124_3$ may not provide sufficient host material (e.g., silicon) to form silicide 152 proximate to the underlying first layer $124_1$, thus degrading the (hiving force for forming dopant clusters 140 in S/D region 124 (discussed below in method 200). In some embodiments, a ratio of vertical thickness $H_3$ to length $L_{124}$ can be greater than about 0.02, greater than about 0.04, greater than about 0.06, greater than about 0.1, or greater than about 0.15 to form dopant clusters 140 in S/D region 124. If the ratio of vertical thickness $H_3$ to length $L_{124}$ is below the above-noted lower limits, capping layer $124_3$ may not provide sufficient host material (e.g., silicon) to form silicide 152 proximate to the underlying first layer $124_1$, thus degrading the driving force for forming dopant clusters 140 in S/D region 124 (discussed below in method 200). In some embodiments, a ratio of vertical thickness $H_3$ to vertical thickness $H_{21}$ can be greater than about 0.03, greater than about 0.05, greater than about 0.1, greater than about 0.15, or greater than about 0.2 to form dopant clusters 140 in S/D region 124. If the ratio of vertical thickness $H_3$ to vertical thickness $H_{21}$ is below the above-noted lower limits, capping layer $124_3$ may not provide sufficient host material (e.g., silicon) to form silicide 152 proximate to the underlying first layer $124_1$, thus degrading the driving force for forming dopant clusters 140 in S/D region 124 (discussed below in method 200). In some embodiments, a ratio of vertical thickness $H_3$ to vertical thickness $H_{22}$ can be greater than about 0.03, greater than about 0.05, greater than about 0.1, greater than about 0.2, greater than about 0.3, or greater than about 0.4 to form dopant clusters 140 in S/D region 124. If the ratio of vertical thickness $H_3$ to vertical thickness $H_{22}$ is below the above-noted lower limits, capping layer $124_3$ may not provide sufficient host material (e.g., silicon) to form silicide 152 proximate to the underlying first layer $124_1$, thus degrading the driving force for forming dopant clusters 140 in S/D region 124 (discussed below in method 200). In some embodiments, capping layer $124_3$ can be made of a compound semiconductor, such as SiGe. In some embodiments, capping layer $124_3$ can be made of SiGe with the atomic concentration of germanium less than about 50%, less than about 40%, less than about 30%, or less than about 25% to form dopant clusters 140 in S/D region 124, as achieved by method 200 (discussed below). If the atomic concentration of germanium of capping layer $124_3$ is beyond the above-noted upper limits, capping layer $124_3$ may not provide sufficient host material (e.g., silicon) to form silicide 152 proximate to first layer $124_1$, thus degrading the driving force for forming dopant clusters 140 in S/D region 124 (discussed below in method 200). In some embodiments, capping layer $124_3$ can be made of SiGe with the atomic concentration of germanium from about 5% to about 50%, from about 5% to about 40%, from about 5% to about 30%, from about 5% to about 25%, from about 5% to about 20%, or from about 5% to about 15% to form dopant clusters 140 in S/D region 124, as achieved by method 200 (discussed below). If the atomic concentration of germanium of capping layer $124_3$ is beyond the above-noted upper limits, capping layer $124_3$ may not provide sufficient host material (e.g., silicon) to form silicide 152 proximate to first layer $124_1$, thus degrading the driving force for forming dopant clusters 140 in S/D region 124 (discussed below in method 200). If the atomic concentration of germanium of capping layer $124_3$ is below the above-noted lower limits, the lattice mismatch between capping layer $124_3$ and third layer $124_{22}$ may be increased to cause crystal defects (e.g., dislocations) in S/D region 124. In some embodiments, capping layer $124_3$ can include SiGe with the atomic concentration of germanium gradually increasing along a vertical direction (e.g., in the z-direction) away from junction $J_3$. In some embodiments, capping layer $124_3$ can be made of pure silicon.

In some embodiments, capping layer $124_3$ can be doped with p-type dopants, such as boron, indium, aluminum, gallium, zinc, beryllium, and magnesium. In some embodiments, capping layer $124_3$ can be doped with p-type dopants having any suitable concentration lower than that of first layer $124_1$, second layer $124_{21}$, or third layer $124_{22}$, such as having a concentration less than $3\times10/cm^3$. In some embodiments, capping layer $124_3$ can be doped with p-type dopants having a concentration substantially constant along a vertical direction (e.g., in the z-direction) away from top surface $108_T$. In some embodiments, capping layer $124_3$ can be doped with n-type dopants, such as phosphorus and arsenic, or intrinsic dopants, such as iron and chromium.

Semiconductor device 100 can further include an interlayer dielectric (ILD) layer 130 to provide electrical isolation to structural elements it surrounds or covers, such as gate structure 110 and S/D regions 124. ILD layer 130 can be include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the scope and spirit of this disclosure.

Semiconductor device 100 can further include a layer of insulating material 148 formed over gate structure 110 and ILD layer 130. Layer of insulating material 148 can electrically isolate gate structure 110 and S/D region 124 from an interconnect structure (not shown in FIGS. 1A-1C) formed over FET 101. Layer of insulating material 148 can be made of any suitable insulating material, such as silicon oxide, silicon nitride, a low-k dielectric material, and a high-k dielectric material. Further, layer of insulating material 148 can be made of any suitable thickness, such as from about 10 nm to about 400 nm, that can provide sufficient electrical insulation between FETs 101 and the interconnect structure (not shown in FIGS. 1A-1C) formed over FETs 101. Based on the disclosure herein, other insulating materials and thicknesses for layer of insulating material 148 are within the scope and spirit of this disclosure.

Semiconductor device 100 can further include a trench conductor structure 150 formed through layer of insulating material 148. Trench conductor structure 150 can electrically connect FET 101's S/D region 124 to the interconnect structure (not shown in FIGS. 1A-1C) formed over FET 101. In some embodiments, trench conductor structure 150 can connect FET 101's gate structure 110 to the interconnect structure formed over FET 101. In some embodiments, trench conductor structure 150 can protrude into S/D region 124. For example, as shown in FIGS. 1B and 1C, trench conductor structure 150 can include a silicide layer 152 protruding S/D region 124 and a layer of conductive material 154 formed over silicide layer 152. Silicide layer 152 can include a metal silicide material to provide a low resistance interface between layer of conductive material 154 and S/D region 124. In some embodiments, silicide layer 152 can be formed through S/D region 124's capping layer $124_3$ and protruding S/D region 124's third layer $124_{22}$. In some embodiments, silicide layer 152 can be formed through S/D region 124's capping layer $124_3$ and third layer $124_{22}$, and protruding S/D region 124's second layer $124_{21}$. Silicide layer 152 can be a metal silicide that can include titanium, cobalt, nickel, platinum, palladium, tungsten, molybdenum, tantalum, vanadium, chromium, silicon, or germanium. Layer of conductive material 154 can include any suitable conductive material that provide low resistance between silicide layer 152 and the interconnect structure (not shown in FIGS. 1A-1C) formed over FET 101. For example, layer of conductive material 154 can include a metallic material, such as copper, tungsten, aluminum, and cobalt. In some embodiments, layer of conductive material 154 can further include a stack of conductive materials (not shown in FIGS. 1A-1C), such as a conductive nitride material (e.g., titanium nitride or tantalum nitride), that can act as a diffusion barrier, an adhesion promotion layer, or a nucleation layer to embed the above-noted metallic materials in layer of insulating material 148. Based on the disclosure herein, other materials for silicide layer 152 and layer of conductive material 154 are within the scope and spirit of this disclosure.

Silicide layer 152 can be formed proximate to S/D region 124's first layer $124_1$ to form dopant clusters 140 in S/D region 124, as achieved by method 200 (discussed below). For example, as shown in FIG. 1C, first layer $124_1$ can include a compound semiconductor material (e.g., SiGe) with a rich atomic percentage of a host material (e.g., atomic percentage of silicon greater than about 60%). Silicide layer 152 can be formed proximate to first layer $124_1$ to result in a sufficient driving force to draw the host material (e.g., silicon) from first layer $124_1$ towards silicide layer 152. Such driving force can precipitate the dopants (e.g., boron) doped in S/D region 124 to form dopant clusters 140 in S/D region 124. In some embodiments, a vertical (e.g., in the z-direction) separation $d_1$ between silicide layer 152's bottom surface $152_B$ and first layer $124_1$ can be less than about 10 nm, such as from about 1 nm to about 10 nm, from about 2 nm to about 9 nm, and from about 3 nm to about 8 nm, to provide the sufficient driving force to form dopant clusters 140 in S/D region 124. If vertical separation $d_1$ is below the above-noted lower limits, FET 101 may have a high contact resistance. If vertical separation $d_1$ is beyond the above-noted upper limits, the driving force that draws first layer $124_1$'s host material (silicon) for forming dopant clusters 140 can be degraded. In some embodiments, a horizontal (e.g., in the x-direction) separation $d_2$ between a portion of silicide layer 152's sidewall proximate to silicide layer 152's bottom surface $152_B$ and first layer $124_1$ can be less than about 10 nm, such as from about 1 nm to about 9 nm, from about 2 nm to about 8 nm, and from about 3 nm to about 7 nm, to provide the sufficient driving force to form dopant, clusters 140 in S/D region 124. If horizontal separation $d_2$ is below the above-noted lower limits, FET 101 may have a high contact resistance. If horizontal separation $d_2$ is beyond the above-noted upper limits, the driving force that draws first layer $124_1$'s host material (silicon) for forming dopant clusters 140 can be degraded. In some embodiments, silicide layer 152 can be proximate to first layer $124_1$ to provide the sufficient driving force to form dopant clusters 140 in S/D region 124, where a ratio of separation $d_2$ to silicide layer 152's bottom width $L_{152}$ can be less than about 0.5, such as less than about 0.4, less than about 0.3, and less than about 0.2. If the ratio of separation $d_2$ to width $L_{152}$ is beyond the above-noted upper limits, the driving force that draws first layer $124_1$'s host material (silicon) for forming dopant clusters 140 can be degraded. In some embodiments, silicide layer 152 can be proximate to first layer $124_1$ to provide the sufficient driving force to form dopant clusters 140 in S/D region 124, where a ratio of silicide layer 152's bottom width $L_{152}$ to S/D region 124's length $L_{124}$ can be from about 0.5 to about 1.0, such as from about 0.5 to about 0.9, from about 0.5 to about 0.8, from about 0.5 to about 0.7, and from about 0.5 to about 0.6. If the ratio of width $L_{152}$ to length $L_{124}$ is below the above-noted lower limits, the driving force that draws first layer $124_1$'s host material (silicon) for forming dopant clusters 140 can be degraded. If the ratio of width $L_{152}$ to length $L_{124}$ is beyond the above-noted upper limits, FET 101 may have a high contact resistance. In some embodiments, first layer $124_1$ can have a side thickness (e.g., lateral thickness $t_1$) greater than a threshold to provide sufficient host material (e.g., silicon) to silicide layer 152 to form dopant clusters 140 in S/D region 124. For example, first layer $124_1$ can have a lateral (e.g., in the x-direction) thickness $t_1$ proximate to a portion of first layer $124_1$ that vertically (e.g., in the z-direction) aligns with silicide layer 152's bottom surface 152B, where thickness $t_1$ can be greater than about 5 nm, such as greater than about 10 nm, greater than about 20 nm, greater than about 25 nm, and greater than about 30 nm, to provide sufficient host material (e.g., silicon) to silicide layer 152 to form dopant clusters 140 in S/D region 124. If thickness $t_1$ is below the above-noted lower limits, first layer 124$_1$ may not provide sufficient host material (e.g., silicon) to form silicide 152 proximate to first layer 124$_1$, thus degrading the driving force for forming dopant clusters 140 in S/D region 124 (discussed below in method 200). In some embodiments, separation of $d_2$ can represent second layer 124$_{21}$'s lateral thickness formed over silicide layer 152's side surface, where a ratio of thickness $t_1$ to separation $d_2$ can be from about 0.6 to about 1.4, from about 0.7 to about 1.3, or from about 0.8 to about 1.2 to provide sufficient host material (e.g., silicon) to silicide layer 152 to form dopant clusters 140 in S/D region 124. If the ratio of thickness $t_1$ to separation $d_2$ is below the above-noted lower limits, the driving force that draws first layer 124$_1$'s host material (silicon) for forming dopant dusters 140 can be degraded. If the ratio of thickness $t_1$ to separation $d_2$ is beyond the above-noted upper limits, FET 101 may have a high contact resistance.

Dopant cluster 140 can be embedded in S/D region 124 in the form of atom/molecule aggregations. For example, dopant cluster 140 can include multiple dopants (not shown in FIGS. 1B and 1C) that can be proximate to one another. In some embodiments, dopant cluster 140 can further include a vacancy structure (not shown in FIGS. 1B and 1C) that can be embedded in the multiple dopants of dopant cluster 140. In some embodiments, dopant cluster 140 embedded in S/D region 124 can be different from dopants doped in S/D region 124. For example, dopants doped in S/D region 124 can individually occupy a lattice site of S/D region 124's crystalline structure, while dopant cluster 140 can be an atom/molecule aggregation scattered in S/D region 124 and not incorporated in S/D region 124's lattice structure. In some embodiments, dopant cluster 140 can be made of a same material as the dopants in S/D region 124. For example, S/D region 124 can be doped with a p-type dopant (e.g., boron), where such p-type doped S/D region 124 can further include dopant clusters 140 made of the same material of the p-type dopant (e.g., dopant clusters 140 can be boron clusters.) In some embodiments, a concentration of dopant clusters 140 of a dopant material (e.g., boron) in S/D region 124 can be greater than a maximum doping concentration of the same dopant material (e.g., boron) doped in S/D region 124 determined by the solid solubility limit of the dopant material (e.g., boron) in S/D region 124. In some embodiments, dopant clusters 140 of a dopant material can be embedded in S/D region 124 with an atomic percentage from about 1% to about 10%, from about 2% to about 10%, from about 3% to about 8%, or from about 3% to about 6%, where the above-noted atomic percentage ranges can be substantially equal to or greater than the solid solubility of the dopant material in S/D region 124. In some embodiments, dopant clusters 140 of a dopant material can be embedded in S/D region 124 with a concentration from about $3\times10^{20}/cm^3$ to about $6\times10^{22}/cm^3$, from about $1\times10^{21}/cm^3$ to about $3\times10^{22}/cm^3$, or from about $1\times10^{21}/cm^3$ to about $1\times10^{22}/cm^3$, where the above-noted atomic percentage ranges can be substantially equal to or greater than the solid solubility of the dopant material in S/D region 124. In some embodiments, a maximum atomic percentage of a dopant material in each of S/D region 124's sub-regions (e.g., first layer 124$_1$, second layer 124$_{21}$, or third layer 124$_{22}$) can be from about 1% to about 10%, from about 3% to about 10%, from about 3% to about 6%, where the dopant material can be doped S/D region 124 as the dopants and/or precipitated in S/D region 124 as dopant clusters 140. In some embodiments, a maximum concentration of a dopant material in each of S/D region 124's sub-regions (e.g., first layer 124$_1$, second layer 124$_{21}$, or third layer 124$_{22}$) can be from about $3\times10^{20}/cm^3$ to about $6\times10^{22}/cm^3$, from about $1\times10^{21}/cm^3$ to about $3\times10^{22}/cm^3$, or from about $1\times10^{21}/cm^3$ to about $1\times10^{22}/cm^3$, where the dopant material can be doped S/D region 124 as the dopants and/or precipitated in S/D region 124 as dopant clusters 140. In some embodiments, by embedding dopant clusters 140 with the above-noted atomic ranges in S/D region 124, the effective bandgap of S/D region 124 can be reduced, thus increasing the carrier concentration (e.g., hole concentration) in S/D region 124 to lower the contact resistance associated with FET 101.

In some embodiments, dopant clusters 140 can be distributed in a cluster region 140A proximate to silicide layer 152. For example, as shown in FIG. 1B, cluster region 140A can vertically (e.g., in the z-direction) span from silicide layer 152's sidewall with a vertical dimension $S_{140Z}$ less than about 10 nm, less than about 8 nm, less than about 5 nm, or less than about 3 nm. If dimension $S_{140Z}$ is greater than the above-noted upper limits, the separation between silicide layer 152 (discussed below) and first layer 124$_1$ can be increased to degrade the driving force for forming dopant clusters 140 in S/D region 124 (discussed below in method 200). In some embodiments, cluster region 140A can have a vertical (e.g., in the z-direction) span $H_{140}$ substantially equal to or less than vertical dimension $S_{140Z}$. Similarly, as shown in FIG. 1C, cluster region 140A can laterally (e.g., in the x-direction) span from silicide layer 152's sidewall with a lateral dimension $S_{140X}$ substantially equal to or less than the combination (e.g., thickness $t_1$+separation $d_2$) of thickness $t_1$ and separation $d_2$. In some embodiments, cluster region 140A can laterally (e.g., in the x-direction) span with a dimension substantially equal to S/D region 124' length $L_{124}$. In some embodiments, cluster region 140A can overlap with junctions $J_1$, $J_2$, and/or $J_3$. In some embodiments, cluster region 140A can overlap with silicide layer 152 (e.g., dopant clusters 140 formed in silicide layer 152).

Figure 2:
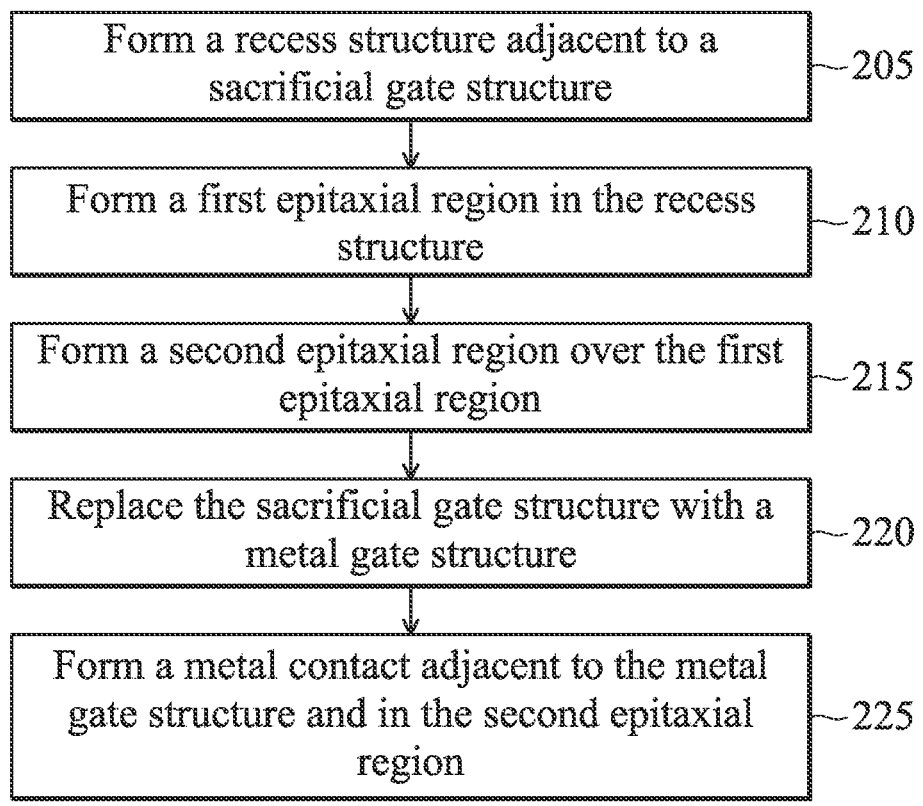
FIG. 2 is a flow diagram of a method for fabricating a semiconductor device, according to some embodiments.
Figure 3:
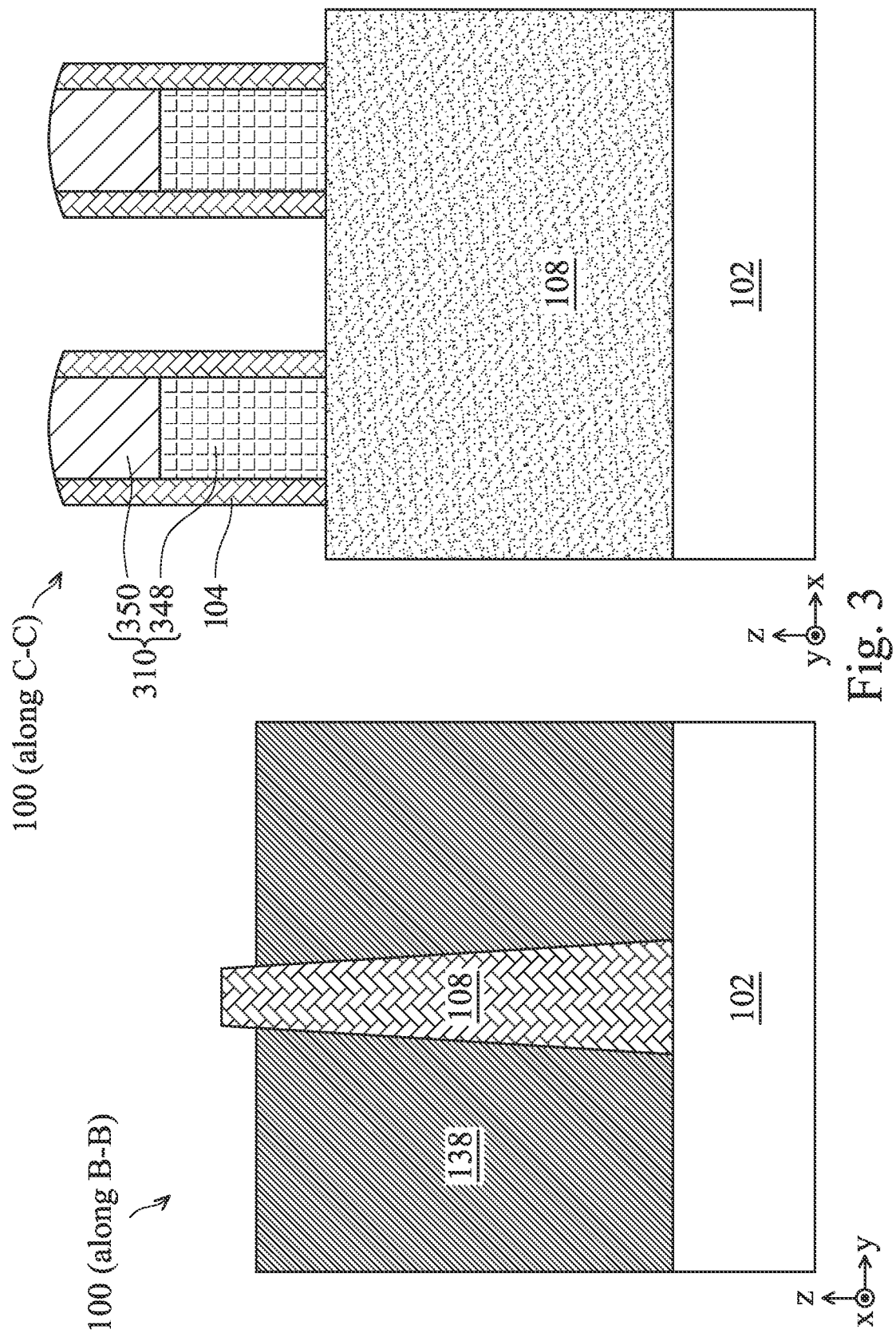
FIG. 3 illustrates cross-sectional views along lines B-B and C-C of structure of Fig. 1A at various stages of its fabrication, according to some embodiments.
Figure 4:
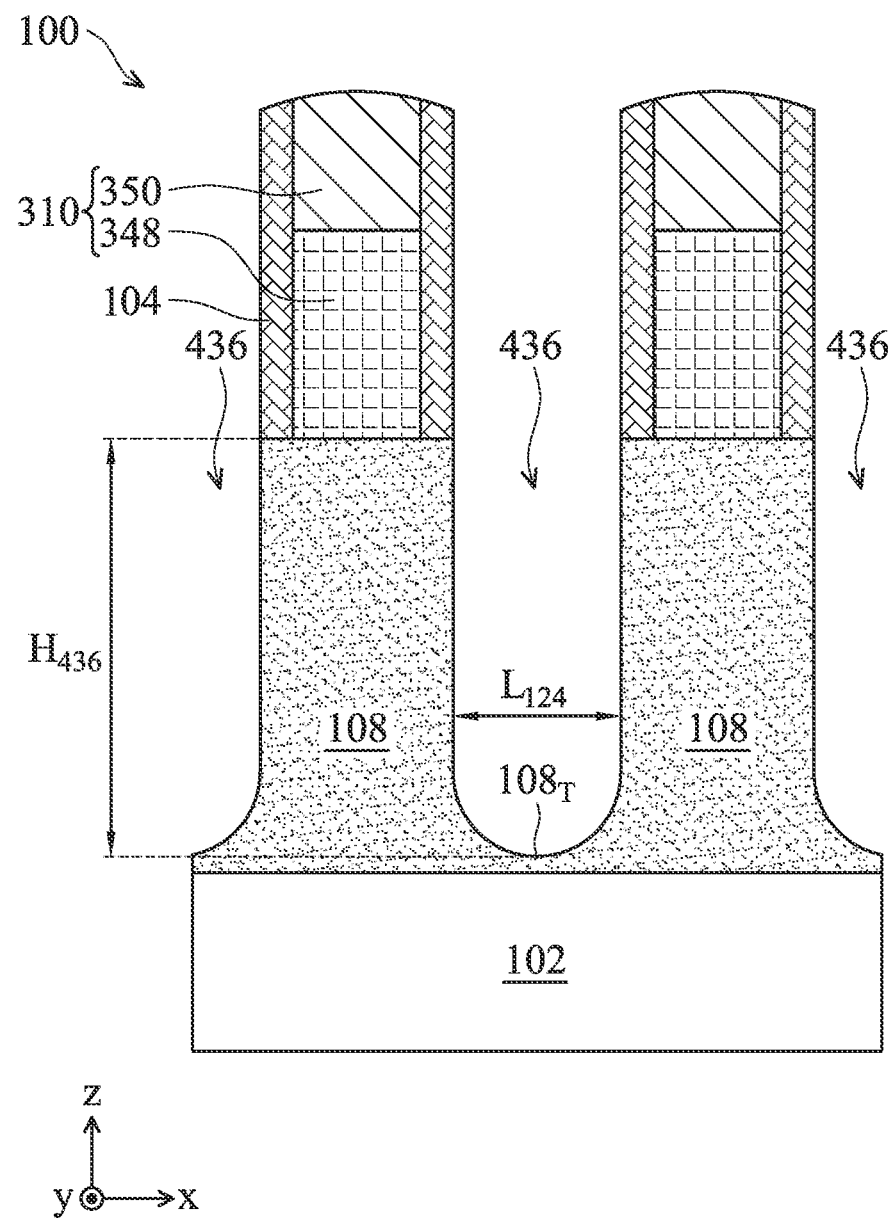
FIGS. 4-9 are cross-sectional views of a semiconductor device at various stages of its fabrication process, according to some embodiments.
Figure 5:
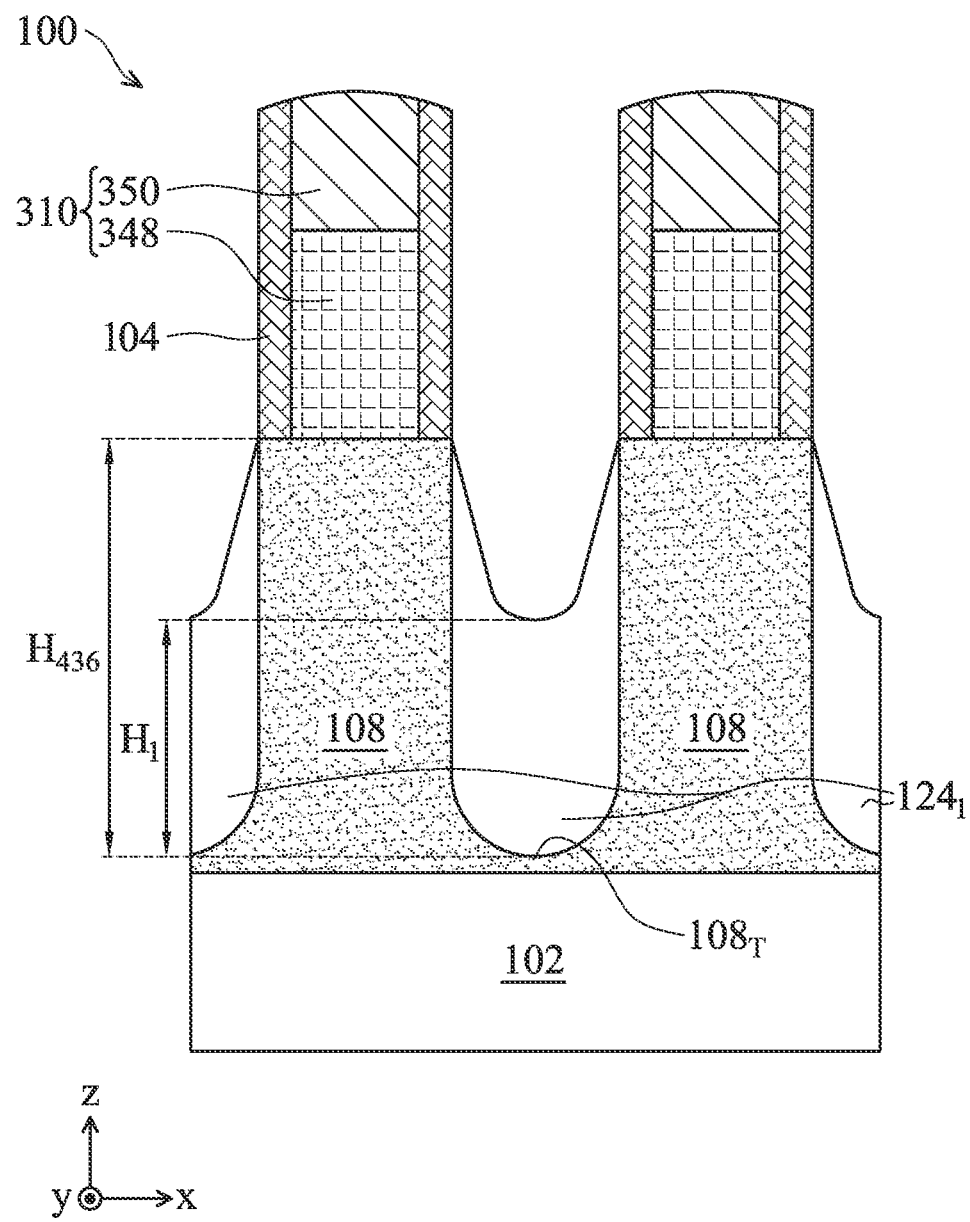
Figure 10:
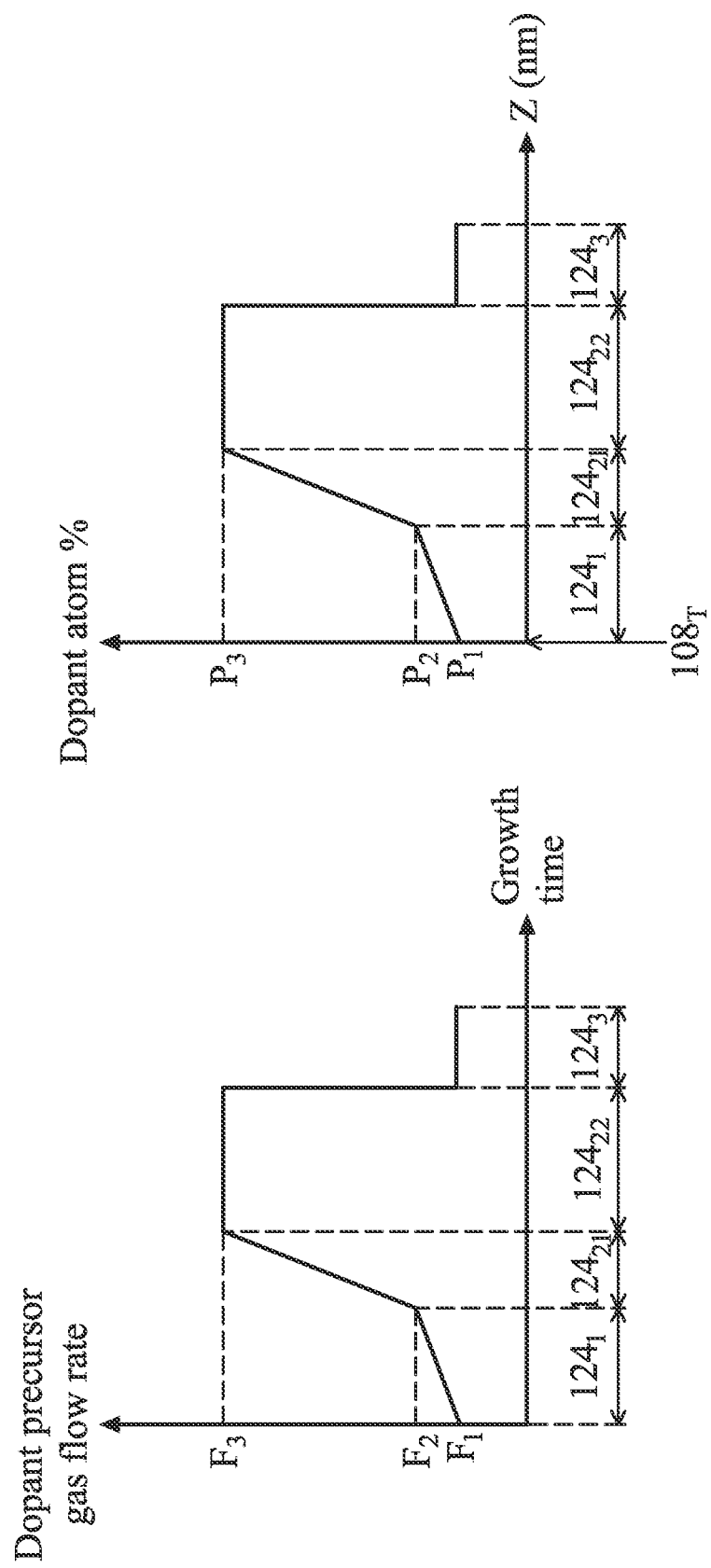
FIG. 10 illustrates a dopant precursor gas flow of a semiconductor device at various stages of its fabrication process and doping concentration profiles of a semiconductor device, according to some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3-10. FIG. 3 illustrates cross-sectional views along lines B-B and C-C of structure of FIG. 1A at various stages of its fabrication, according to some embodiments. FIGS. 4-9 illustrates cross-sectional views along line C-C of structure of FIG. 1A at various stages of its fabrication, according to some embodiments. FIG. 10 illustrates the usage of dopant precursor and the atomic concentration of doping clusters in method 200, according to some embodiments. Operations can be performed in a different order or not performed depending on specific applications. Method 200 may not produce a complete semiconductor device 100. Accordingly, it is understood that additional processes can be provided before, during, and/or after method 200, and that some other processes may be briefly described herein. Further, the discussion of elements in FIGS. 1A-1C and 3-10 with the same annotations applies to each other, unless mentioned otherwise.

Referring to FIG. 2, in operation 205, a recess structure is formed adjacent to a sacrificial gate structure. For example, a recess structure 436 (shown in FIG. 4) can be formed over substrate 102 and adjacent to a sacrificial gate structure 310 with reference to FIGS. 3 and 4. The process of forming recess structure 436 can include (i) forming fin structures 108 (shown in FIG. 3) over substrate 102; (ii) forming sacrificial gate structures 310 (shown in FIG. 3) over fin structures 108; and (iii) removing fin structures 108 through sacrificial gate structures 310 to form recess structure 436.

Referring to FIG. 3, the process of forming fin structures 108 can include (i) providing substrate 102; (ii) etching substrate 102 through a patterned mask layer (not shown in FIG. 3) using an etch process; and (iii) forming STI region 138 over the etched substrate 102 using a deposition process and an etch back process. The etch process for etching substrate 102 can include a dry etch process or a wet etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. In some embodiments, the deposition process for forming STI region 138 can include any suitable growth process, such as a physical vapor deposition (PVD) process, a chemical vapor deposition (CVD) process, a high-density-plasma (HDP) CVD process, a flowable CVD (FCVD) process, and an atomic layer deposition (ALD) process. In some embodiments, the etch back process for forming STI region 138 can include a dry etch process, a wet etch process, or a polishing process, such as chemical mechanical processing (CMP) process. Based on the disclosure herein, other processes for forming fin structures 108 are within the spirit and scope of this disclosure.

The process of forming sacrificial gate structure 310 can include (i) blanket depositing a polysilicon layer 348 and a hard mask layer 350 over fin structures 108 using a suitable deposition process, such as a CVD process, a PVD process, and an ALD process; (ii) removing polysilicon layer 348 and hard mask layer 350 through a patterned mask layer (not shown in FIG. 3) using an etching process; and (iii) forming gate spacers 104 over sidewalk of polysilicon layer 348 using a suitable deposition process and an etch process. Based on the disclosure herein, other processes for forming sacrificial gate structures 310 are within the spirit and scope of this disclosure.

After forming sacrificial gate structure 310, recess structure 436 can be formed by removing fin structures 108 through sacrificial gate structures 310 using an etching process. The etching process can include a dry etch process or a wet etch process. In some embodiments, the etching process can be a time-etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. The resulting recess structure 436 can span with length $L_{124}$ associated with two adjacent sacrificial gate structure 310's separation. Further, the resulting recess structure 436 can protrude in fin structure 108 with a depth $H_{436}$ to define top surface $108_T$ of portions of fin structure 108 that are laterally (e.g., in the x-direction) outside sacrificial gate structure 310. In some embodiments, depth $H_{436}$ can be any suitable dimension, such as from about 30 nm to about 70 nm and from about 40 nm to about 60 nm. Based on the disclosure herein, other lengths and depths of recess structures 436 are within the spirit and scope of this disclosure.

Referring to FIG. 2, in operation 210, a first epitaxial region is formed in the recess structure. For example, first layer $124_1$ (shown in FIG. 5) can be formed in recess structure 436 of FIG. 4 with reference to FIGS. 5 and 10. The process of forming first layer $124_1$ can include epitaxially growing a semiconductor material of vertical thickness $H_1$ measured from top surface 108 using an epitaxial growth process. In some embodiments, the epitaxial growth process can selectively grow first layer $124_1$ over recess structure 436's side surfaces and bottom surface (e.g., top surface $108_T$), while exposing sacrificial gate structures 310. The epitaxial growth process can include (i) a CVD process, such as a low pressure CVD (LPCVD) process, a rapid thermal CVD (RTCVD) process, a metal-organic CVD (MOCVD) process, an atomic layer CVD (ALCVD) process, an ultra-high vacuum CVD (UHVCVD) process, and a reduced pressure CVD (RPCVD) process; (ii) a molecular beam epitaxy (MBE) processes; (iii) an epitaxial deposition/partial etch process, such as a cyclic deposition-etch (CDE) process; or (iv) a selective epitaxial growth (SEG) process. The epitaxial process can be conducted using suitable processing gases associated with the semiconductor material of first layer $124_1$. For example, first layer $124_1$ can include SiGe, where the processing gases can include silane ($SiH_4$), disilane ($Si_2H_6$), dichlorosilane (DCS), germane ($GeH_4$), hydrogen ($H_2$), and nitrogen ($N_2$). In some embodiments, first layer $124_1$ can include a compound semiconductor material, where at least one element of the compound semiconductor material can be the host material that can be supplied to silicide layer 152 (formed at operation 225) to assist precipitating dopant clusters 140 (formed at operation 225) in S/D region 124. For example, first layer $124_1$ can include SiGe having the atomic concentration of silicon greater than about 65% to assist precipitating dopant clusters 140 in S/D region 124. In some embodiments, first layer $124_1$ can have thickness $H_1$ greater than a threshold to provide reduced separations $d_1$ and $d_2$ (shown in FIGS. 1C and 9) to silicide layer 152 (formed at operation 225) to assist precipitating dopant clusters 140 in S/D region 124. For example, a ratio of first layer $124_1$'s thickness $H_1$ to recess structure 436's depth $H_{436}$ can be greater than about 0.1, greater than about 0.2, or greater than about 0.3 to assist precipitating dopant clusters 140 in S/D region 124.

The process of forming first layer $124_1$ can further include doping the grown semiconductor layer with dopants during the epitaxial growth process. For example, referring to FIG. 10, a dopant precursor gas with a flow rate $F_1$ can be included in the epitaxial growth process to result in first layer $124_1$ in-situ doped with dopants having an atomic percentage $P_1$. In some embodiments, first layer $124_1$ can be in-situ doped with boron having atomic percentage $P_1$ of about 0.5%, where the associated dopant precursor gas can include diborane ($B_2H_6$), boron difluoride ($BF_2$), or boron trifluoride ($BF_3$) with flow rate $F_1$ about 100 standard cubic centimeters per minute (sccm). In some embodiments, dopant precursor gas flow can gradually increase from flow rate $F_1$ to a flow rate $F_2$ to result in first layer $124_1$ in-situ doped with dopants having an atomic percentage gradually increasing from atomic percentage $P_1$ to an atomic percentage $P_2$ along a vertical direction (e.g., in the z-direction) away from top surface $108_T$. In some embodiments, flow rate $F_2$ can be less than about 200 sccm to result in atomic percentage of $P_2$ less than about 1% to mitigate short channel effects of FET 101. In some embodiments, the dopant precursor gas can include phosphine ($PH_3$) and arsine ($AsH_3$) that can respectively in-situ dope phosphorus and arsenic in first layer $124_1$. Based on the disclosure herein, other epitaxial growth processes, processing gases, dopant precursor gases, and dopant precursor gas flow rates for forming first layer $124_1$ are within the spirit and scope of this disclosure.

Referring to FIG. 2, in operation 215, a second epitaxial region is formed over the first epitaxial region. For example, second layer $124_{21}$ (shown in FIG. 6) can be formed over first layer $124_1$ of FIG. 5 with reference to FIGS. 6 and 10. The process of forming second layer $124_{21}$ can include epitaxially growing a semiconductor material of vertical thickness $H_{21}$ over first layer $124_1$ using an epitaxial growth process similar to that for growing first layer $124_1$. In some embodiments, first and second layers $124_1$ and $124_{21}$ can include SiGe, where the epitaxial growth process for growing second layer $124_{21}$ can include supplying higher flow rate of $GeH_4$ to result in second layer $124_{21}$ with higher atomic ratio of germanium than first layer $124_1$. In some embodiments, second layer $124_{21}$'s vertical thickness $H_{21}$ can be thinned for silicide layer 152 (formed in second layer $124_{21}$ at operation 225) proximate to first layer $124_1$ to attract first layer $124_1$'s host material (e.g., silicon) to precipitate dopant clusters 140 in S/D region 124. The process of forming second layer $124_{21}$ can further include doping the grown semiconductor layer with dopants during the epitaxial growth process for second layer $124_{21}$. In some embodiments, second layer $124_{21}$ can be in-situ doped with dopants (e.g., boron) having an atomic percentage $P_3$ close to the dopant's solid solubility (e.g., boron's solid solubility in SiGe) in second layer $124_{21}$ by including a dopant precursor gas (e.g., $B_2H_6$) with a flow rate $F_3$ greater than flow rate $F_3$. For example, the dopant's solid solubility in second layer $124_{21}$ can be substantially equal to or greater than about $3 \times 10^{20}/cm^3$, where second layer $124_{21}$ can be in-situ doped with dopants (e.g., boron) having atomic percentage $P_3$ substantially equal to greater than about $3 \times 10^{20}/cm^3$, such as greater than about $8 \times 10^{20}/cm^3$. The atom percentage $P_3$ can allow silicide layer 152 to extract the dopants (e.g., boron) from second layer $124_{21}$ to precipitate dopant clusters 140 (e.g., boron clusters) in S/D region 124. In some embodiments, a maximum of atomic percentage $P_3$ can be greater than about 1%, greater than about 2%, greater than about 3%, greater than about 4%, greater than about 5%, or greater than about 6% for the p-type dopant doped in SiGe. In some embodiments, the dopant precursor gas flow can gradually increase from flow rate $F_2$ to a flow rate $F_3$ to result in second layer $124_{21}$ in-situ doped with dopants having an atomic percentage gradually increasing from atomic percentage $P_2$ to atomic percentage $P_3$ along a vertical direction (e.g., in the z-direction) away from top surface $108_T$. Based on the disclosure herein, other epitaxial growth processes, processing gases, dopant precursor gases, and dopant precursor gas flow rates for forming second layer $124_{21}$ are within the spirit and scope of this disclosure.

Figure 6:
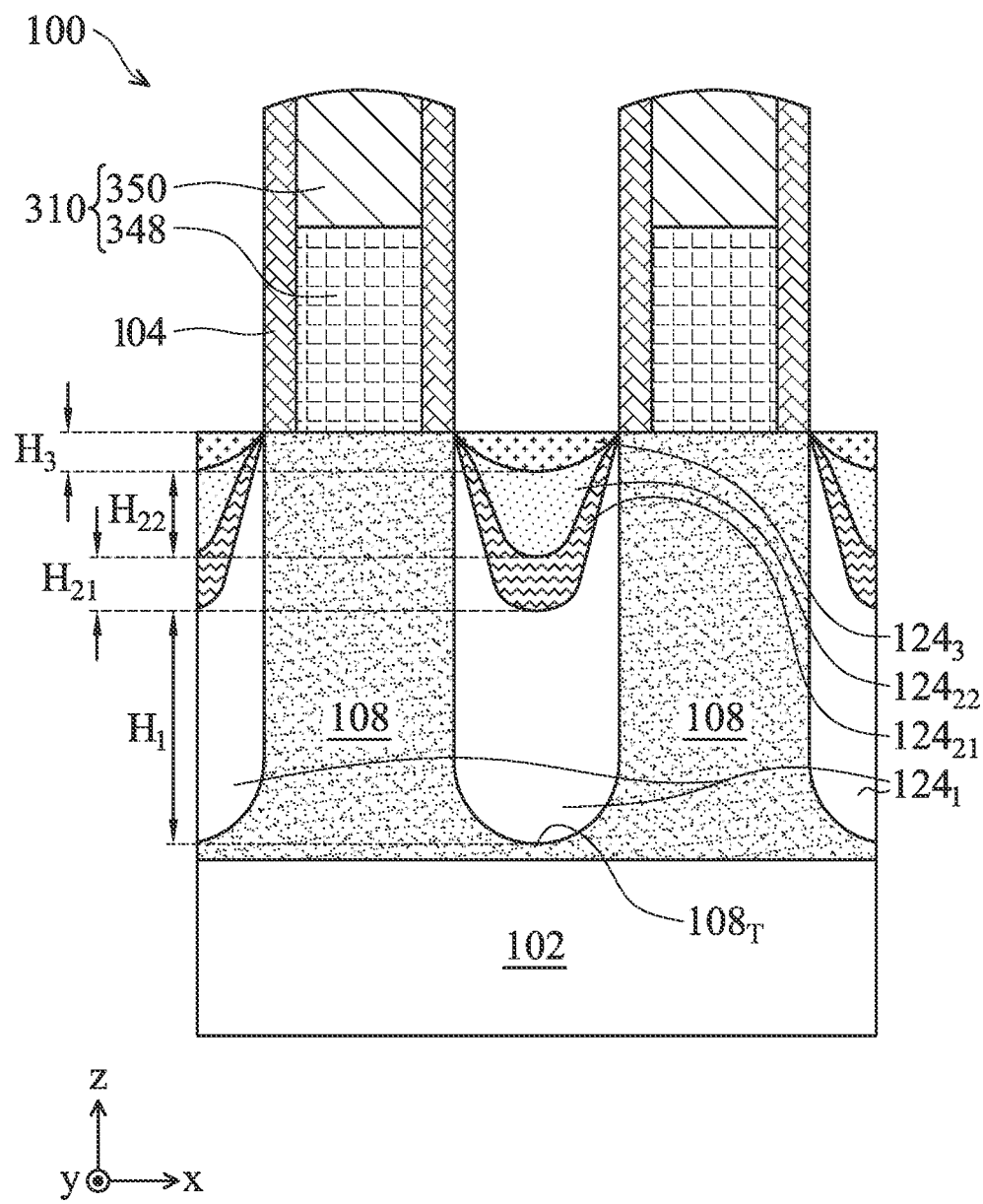
Figure 7:
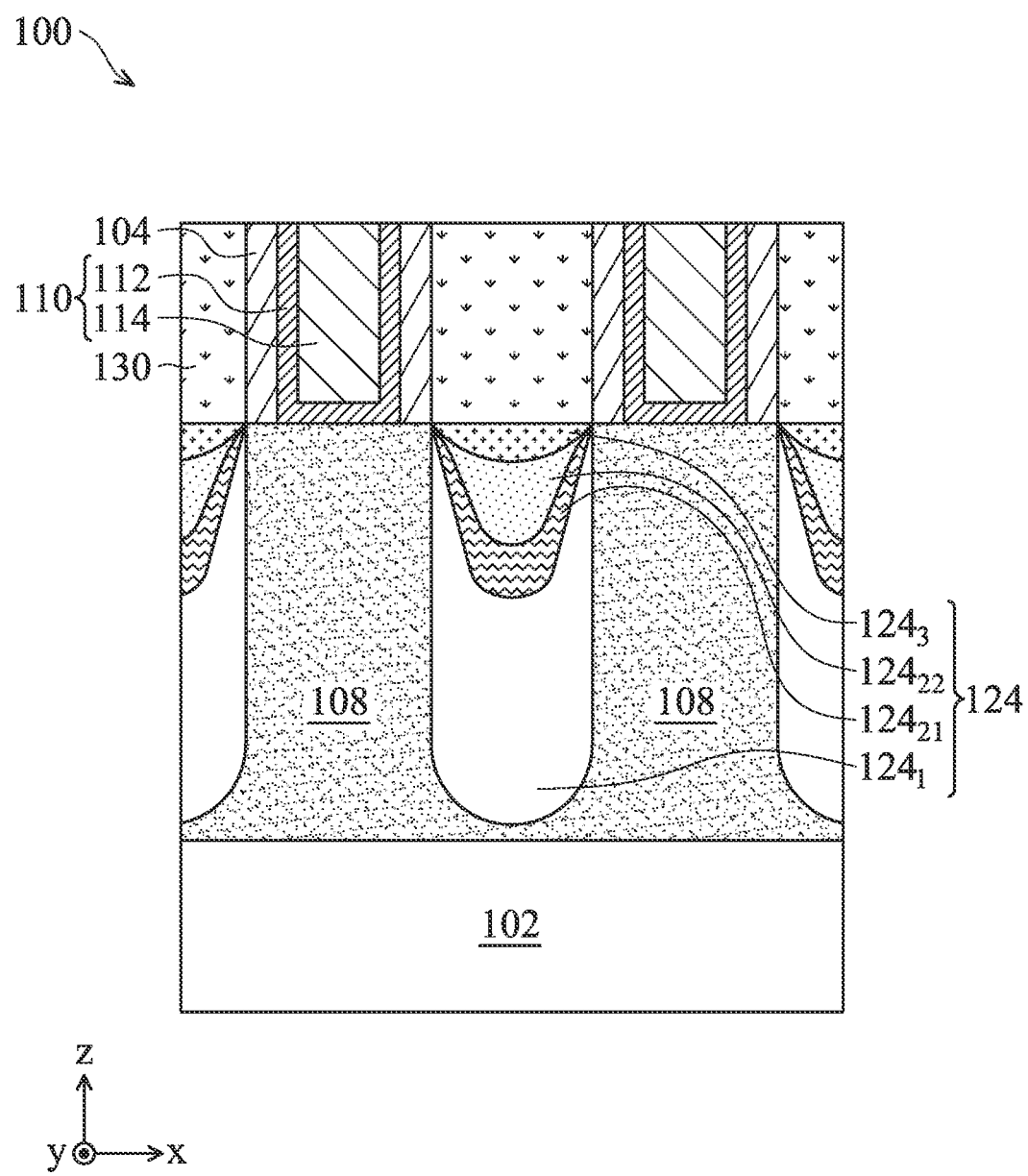
Figure 8:
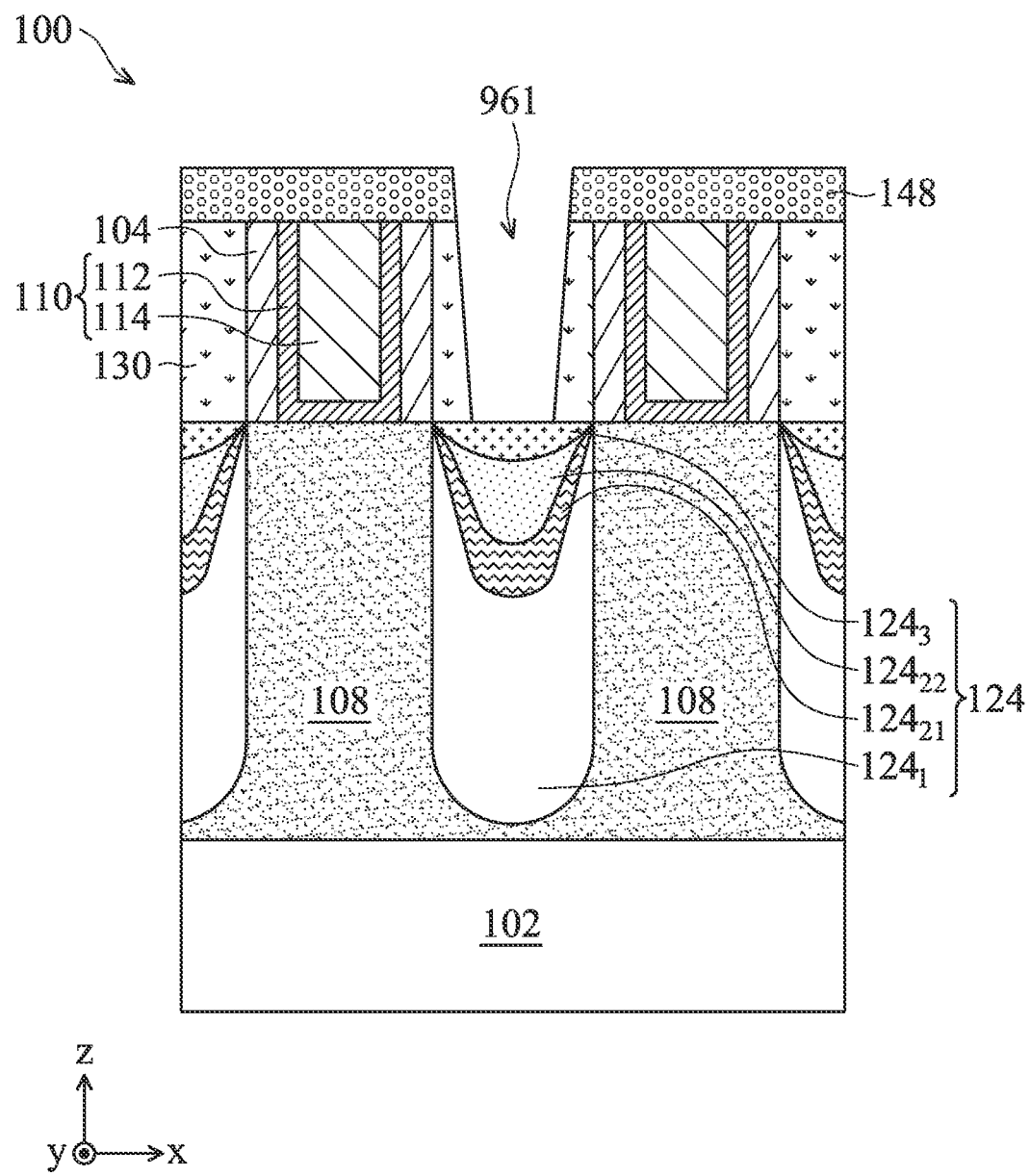
Figure 9:
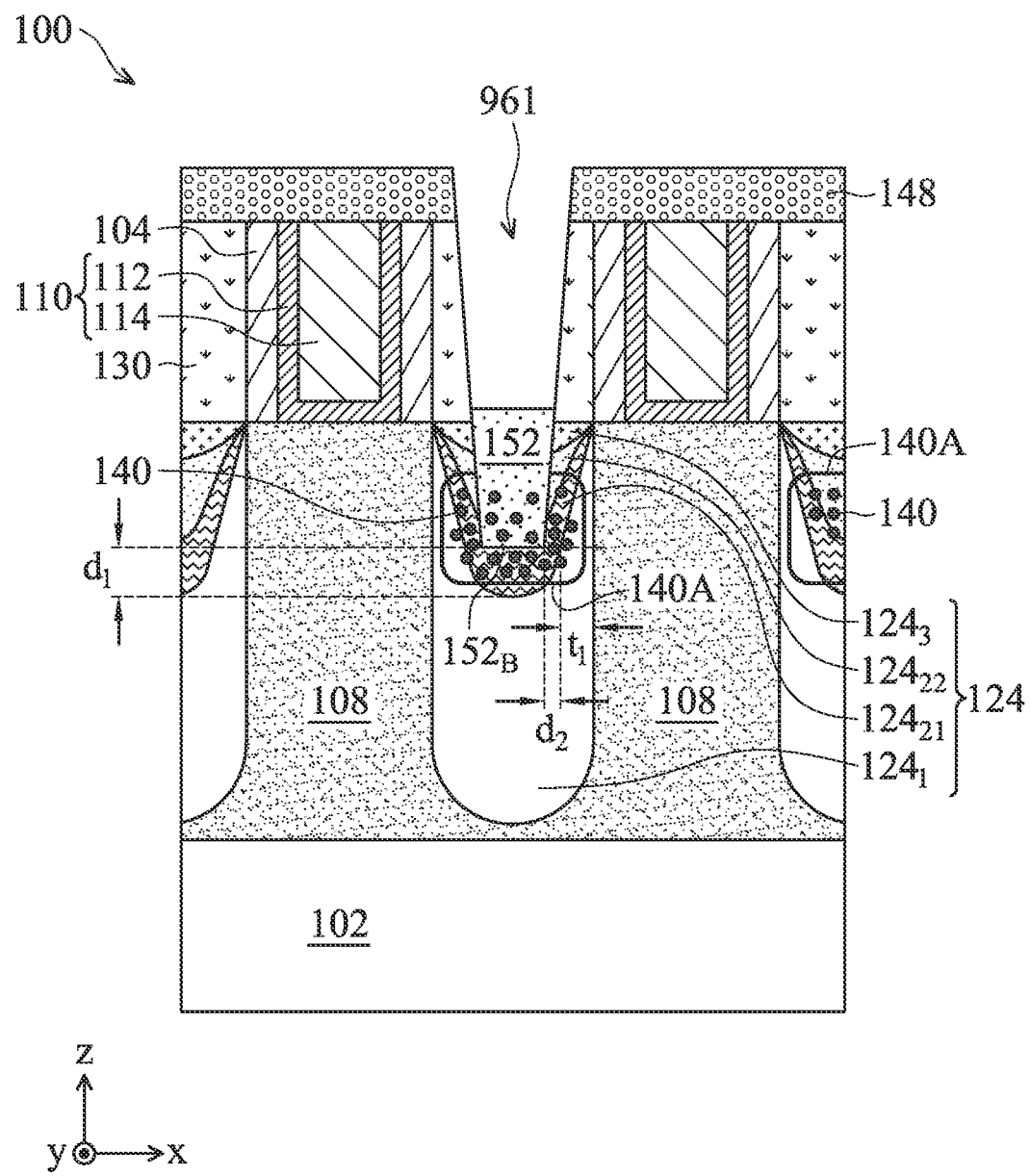

In some embodiments, referring to FIGS. 6 and 10, operation 215 can further include forming third layer $124_{22}$ over second layer $124_{21}$. The process of forming third layer $124_{22}$ can include epitaxially growing a semiconductor material of vertical thickness $H_{22}$ over second layer $124_{21}$ using an epitaxial growth process similar to that for growing second layer $124_{21}$. In some embodiments, third layer $124_{22}$'s vertical thickness $H_{22}$ can be thinned for silicide layer 152 (formed in second layer $124_{21}$ at operation 225) formed through third layer $124_{22}$ and proximate to first layer $124_1$ to attract first layer $124_1$'s host material (e.g., silicon) to precipitate dopant clusters 140 in S/D region 124. The process of forming third layer $124_{22}$ can further include doping the grown semiconductor layer with dopants during the epitaxial growth process for third layer $124_{22}$. In some embodiments, third layer $124_{22}$ can be in-situ doped with dopants (e.g., boron) having atomic percentage $P_3$ close to the dopant's solid solubility (e.g., boron's solid solubility in SiGe) in third layer $124_{22}$ by including a dopant precursor gas (e.g., $B_2H_6$) with flow rate $F_3$. For example, the dopant's solid solubility in third layer $124_{22}$ can be substantially equal to or greater than about $1 \times 10^{21}/cm^3$, where third layer $124_{22}$ can be in-situ doped with dopants (e.g., boron) having atomic percentage $P_3$ substantially equal to greater than about $1 \times 10^{21}/cm^3$, such as greater than about $2 \times 10^{21}/cm^3$. The atom percentage $P_3$ can allow silicide layer 152 to extract the dopants (e.g., boron) from third layer $124_{22}$ to precipitate dopant clusters 140 (e.g., boron clusters) in S/D region 124. In some embodiments, the dopant precursor gas flow can be substantially constant at flow rate $F_3$ to result in third layer $124_{22}$ uniformly in-situ doped with dopants having atomic percentage $P_3$ along a vertical direction (e.g., in the z-direction) away from top surface $108_T$. Based on the disclosure herein, other epitaxial growth processes, processing gases, dopant precursor gases, and dopant precursor gas flow rates for forming third layer $124_{22}$ are within the spirit and scope of this disclosure.

In some embodiments, referring to FIGS. 6 and 10, operation 215 can further include forming capping layer $124_3$ over third layer $124_{22}$. The process of forming capping layer $124_3$ can include epitaxially growing a semiconductor material of vertical thickness $H_3$ over third layer $124_{22}$ using an epitaxial growth process similar to that for growing third layer $124_{22}$. In some embodiments, capping layer $124_3$'s vertical thickness $H_3$ can be thickened to provide sufficient host material (e.g., silicon) to silicide layer 152 (formed at operation 225) to assist precipitating dopant clusters 140 (formed at operation 225) in S/D region 124. The process of forming capping layer $124_3$ can further include doping the grown semiconductor layer with dopants during the epitaxial growth process for capping layer $124_3$. In some embodiments, capping layer $124_3$ can be in-situ doped with dopants (e.g., boron) having an atomic percentage less than atomic percentage $P_2$ by including a dopant precursor gas (e.g., $B_2H_6$) with a flow rate less than flow rate $F_2$. Based on the disclosure herein, other epitaxial growth processes, processing gases, dopant precursor gases, and dopant precursor gases flow rate for forming capping layer $124_3$ are within the spirit and scope of this disclosure.

Referring to FIG. 2, in operation 220, the sacrificial gate structure is replaced with a metal gate structure. For example, sacrificial gate structure 310 can be replaced with gate structure 110 with reference to FIG. 7. The process of forming gate structure 110 can include (i) forming ILD layer 130 over second layer $124_{21}$ using a suitable deposition process, such as a PVD process and a CVD process; (ii) removing hard mask layer 350 to coplanarize polysilicon layer 348 with ILD layer 130 using a polishing process, such as a CMP process; (iii) removing polysilicon layer 348 to form a recess (not shown in FIG. 7) to expose fin structures 108 using an etching process; and (iv) filling gate dielectric layer 112 and a gate electrode 114 in the recess using a suitable deposition process, such as ALD, CVD, and PVD. Based on the disclosure herein, other processes for forming gate structure 110 are within the spirit and scope of this disclosure.

Referring to FIG. 2, in operation 225, a metal contact is formed adjacent to the metal gate structure and in the second epitaxial region. For example, trench conductor structure 150 (shown in FIGS. 1A-1C) can be formed adjacent to gate structure 110 and in second layer $124_{21}$ with reference to FIGS. 8 and 9. The process of forming trench conductor structure 150 can include (i) blanket depositing layer of insulating material 148 over the structure of FIG. 8 (e.g., over gate structure 110, and S/D region 124) via a suitable deposition process, such as a CVD process, a PVD process, and an ALD process; (ii) forming a recess structure 961 (shown in FIG. 8) through layer of insulating material 148 and layer 130 using a lithography process and an etching process; (iii) forming silicide layer 152 in recess structure 961; and (v) forming layer of conductive material 154 (shown in FIGS. 1B and 1C) over silicide layer 152 using a suitable deposition process (e.g., a CVD process, an ALD process, a PVD process, and an e-beam evaporation process) and a polishing process (e.g., a CMP process).

The process of forming silicide layer 152 can include (i) depositing a layer of metallic material, such as titanium, cobalt, nickel, tungsten, and any other suitable metallic material over recess structure 961 to contact S/D region 124; (ii) performing an annealing process to react a portion of the deposited layer of metallic material with S/D region 124; and (iii) removing an un-reacted portion of the deposited layer of metallic material using an etching process. During the annealing process, the deposited layer of metallic material can consume (e.g., react with) the S/D region 124's host material (e.g., silicon) from a nearby region, such as cluster region 140A. The respective solid solubility (dissolved amount) of the dopants in S/D region 124 within cluster region 140A can therefore be decreased, thus releasing the dopants (e.g., boron) from the crystalline structure of S/D region 124 to form dopant clusters 140 of the dopant (e.g., boron clusters). For example, silicide layer 152 can be formed in second layer $124_{21}$ and/or in third layer $124_{22}$ doped with boron with a concentration ranging from atomic percentage $P_2$ to atomic percentage $P_3$. The annealing process for forming silicide layer 152 can extract the dopants (e.g., boron) from second layer $124_{21}$ and/or from third layer $124_{22}$ to result in scattered doping clusters 140 (e.g., boron clusters) proximate to silicide layer 152 (e.g., within cluster region 140A). In some embodiments, the annealing process can draw the host material from portions of S/D region 124 that is beyond the range of cluster region 140A, such as drawing silicon from first layer $124_1$ towards cluster region 140A and/or drawing silicon from capping layer $124_3$ towards cluster region 140A. The annealing process can create a driving force to extract the dopants from S/D region 124 in cluster region 140A to precipitate dopant clusters 140 of the dopants. Therefore, reducing separation $d_1$, reducing separation $d_2$, increasing bottom width $L_{152}$, and increasing thickness $t_1$ can enhance the precipitation of dopant clusters 140, as discussed in FIG. 1C. In some embodiments, the annealing process can include an annealing temperature from about 700° C. to about 1000° C. to form silicide layer 152 associated with separation $d_1$, separation $d_2$, bottom width $L_{152}$, and/or thickness $t_1$ for forming dopant clusters 140. In some embodiments, the annealing process can include an annealing time from about 0.001 seconds to about 0.1 seconds to form silicide layer 152 associated with separation $d_1$, separation $d_2$, bottom width $L_{152}$, and/or thickness $t_1$ for forming dopant clusters 140. In some embodiments, the annealing process can include a rapid thermal annealing (RTA) process or a spike thermal process using LASER to form silicide layer 152 associated with separation $d_1$, separation $d_2$, bottom width $L_{152}$, and/or thickness it for forming dopant clusters 140. Based on the disclosure herein, other annealing durations, annealing temperatures, or annealing methods for forming silicide layer 152 are within the spirit and scope of this disclosure.

The present disclosures provides an exemplary transistor S/D structure and a method for forming the same. The S/D structure can be included with cluster dopants to lower its bandgap to provide a low transistor contact resistance. In some embodiments, the S/D structure can include a first epitaxial layer and a second epitaxial layer formed over the first epitaxial layer. The first and second epitaxial layers can be doped with dopants. In some embodiments, the second epitaxial layer can further include dopant clusters of the dopant to lower the bandgap of the second epitaxial layer. In some embodiments, the method for forming the dopant clusters can include forming a silicide layer in the second epitaxial layer. The silicide layer can extract the dopants from the second epitaxial layer to precipitate the dopant clusters. A benefit of the S/D structures, among others, is to reduce the transistor contact resistance, thus improving transistor performance.

In some embodiments, a method can include providing a substrate, forming a first epitaxial layer over the substrate, and forming a second epitaxial layer over the first epitaxial layer. The process of forming the first epitaxial layer can include doping the first epitaxial layer with a first dopant having a first concentration. The process of forming the second epitaxial layer can include doping the second epitaxial layer with a second dopant having a second concentration greater than the first concentration. The method can further include precipitating the second dopant to form a cluster of the second dopant in the second epitaxial layer.

In some embodiments, a method can include forming a fin structure over a substrate, forming a gate structure over the fin structure, forming a recess structure in the fin structure and adjacent to the gate structure, forming a first epitaxial layer in the recess structure, and forming a second epitaxial layer over the first epitaxial layer. The process of forming the first epitaxial layer can include doping the first epitaxial layer with a first dopant having a first concentration. The process of forming the second epitaxial layer can include doping the second epitaxial layer with a second dopant having a second concentration greater than the first concentration. The method can further include precipitating the second dopant to form a cluster of the second dopant in the second epitaxial layer.

In some embodiments, a semiconductor structure can include a substrate, a fin structure over the substrate, a gate structure over the fin structure, an epitaxial region formed in the fin structure and adjacent to the gate structure. The epitaxial region can embed a plurality of clusters of dopants.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a substrate;
    forming a first epitaxial layer over the substrate, wherein
        forming the first epitaxial layer comprises doping the first epitaxial layer with a first dopant having a first concentration;

forming a second epitaxial layer over the first epitaxial layer, wherein forming the second epitaxial layer comprises doping the second epitaxial layer with a second dopant having a second concentration greater than the first concentration; and precipitating the second dopant to form a cluster of the second dopant in the second epitaxial layer.

2. The method of claim 1, wherein forming the first epitaxial layer comprises epitaxially growing a first silicon germanium layer with a first germanium concentration, and wherein forming the second epitaxial layer comprises epitaxially growing a second silicon germanium layer with a second germanium concentration greater than the first germanium concentration.

3. The method of claim 1, wherein doping the first and the second epitaxial layers comprises flowing a precursor gas containing boron during a deposition process.

4. The method of claim 1,
wherein the second concentration is between about $5 \times 10^{20}/cm^3$ and about $6 \times 10^{21}/cm^3$, and wherein precipitating the second dopant comprises forming a silicide layer in the second epitaxial layer.

5. The method of claim 4, wherein forming the silicide layer comprises forming the silicide layer proximate to the first epitaxial layer, and wherein a separation between the silicide layer and the first epitaxial layer is less than about 5 nm.

6. The method of claim 1, further comprising forming a third epitaxial layer over the second epitaxial layer, wherein forming the third epitaxial layer comprises doping the third epitaxial layer with a third dopant having a third concentration, less than the second concentration, in the third epitaxial layer.

7. The method of claim 1, further comprising forming a third epitaxial layer over the second epitaxial layer, wherein forming the third epitaxial layer comprises doping the third epitaxial layer with a third dopant having a third concentration, greater than the second concentration, in the third epitaxial layer, and wherein precipitating the second dopant comprises forming a silicide layer through the third epitaxial layer and protruding into the second epitaxial layer.

8. A method, comprising:
forming a fin structure over a substrate;
forming a gate structure over the fin structure;
forming a recess structure in the fin structure and adjacent to the gate structure;
forming a first epitaxial layer in the recess structure, wherein forming the first epitaxial layer comprises doping the first epitaxial layer with a first dopant having a first concentration;
forming a second epitaxial layer over the first epitaxial layer, wherein forming the second epitaxial layer comprises doping the second epitaxial layer with a second dopant having a second concentration greater than the first concentration; and
precipitating the second dopant to form a cluster of the second dopant in the second epitaxial layer.

9. The method of claim 8, wherein:
forming the recess structure comprises forming two opposite side surfaces in the fin structure, wherein the two opposite side surfaces are separated by a lateral separation; and
precipitating the second dopant comprises forming a silicide layer in the second epitaxial layer having a bottom width, wherein a ratio of the bottom width to the lateral separation is from about 0.5 to about 0.9.

10. The method of claim 8, wherein:
forming the first epitaxial layer comprises epitaxially growing a first silicon germanium layer with a first germanium concentration;
forming the second epitaxial layer comprises epitaxially growing a second silicon germanium layer with a second germanium concentration higher than the first germanium concentration; and
doping the first and the second epitaxial layers comprises flowing a precursor gas containing boron.

11. The method of claim 8, wherein:
forming the recess structure comprises forming side surfaces in the fin structure,
forming the first epitaxial layer comprises epitaxially growing the first epitaxial layer of a first lateral thickness over the side surfaces;
forming the second epitaxial layer comprises epitaxially growing the second epitaxial layer of a second lateral thickness over the side surfaces; and
a ratio of the first lateral thickness to the second lateral thickness is from about 0.5 to about 1.0.

12. The method of claim 8,
wherein the second concentration is between about $5 \times 10^{20}/cm^3$ and about $6 \times 10^{21}/cm^3$, and wherein precipitating the second dopant comprises forming a silicide layer in the second epitaxial layer.

13. The method of claim 8, wherein precipitating the second dopant comprises forming a silicide layer proximate to the first epitaxial layer, wherein a separation between the silicide layer and the first epitaxial layer is less than about 5 nm.

14. The method of claim 8, further comprising forming a third epitaxial layer over the second epitaxial layer, wherein:
forming the third epitaxial layer comprises doping the third epitaxial layer with a third dopant having a third concentration less than the second concentration; and
a ratio of a thickness of the third epitaxial layer to a thickness of the second epitaxial layer is from about 0.5 to about 1.0.

15. The method of claim 8, further comprising:
forming a third epitaxial layer over the second epitaxial layer, wherein forming the third epitaxial layer comprises doping the third epitaxial layer with a third dopant having a third concentration greater than the second concentration; and
precipitating the third dopant from the third epitaxial layer to form a cluster of the third dopant in the third epitaxial layer.

16. A semiconductor structure, comprising:
a substrate;
a fin structure over the substrate;
a gate structure over the fin structure; and
an epitaxial region formed in the fin structure and adjacent to the gate structure, wherein the epitaxial region embeds a plurality of clusters of dopants.

17. The semiconductor structure of claim 16, wherein each of the plurality of clusters of dopants comprises a plurality of boron atoms proximate to one another.

18. The semiconductor structure of claim 16, wherein a maximum of an atomic percentage of the dopants in the epitaxial region is from about 2% to about 10%.

19. The semiconductor structure of claim 16, wherein the epitaxial region comprises:
a first epitaxial layer protruding in the fin structure, wherein the first epitaxial layer comprises a first silicon germanium layer with a first germanium concentration; and a second epitaxial layer formed over the first epitaxial layer, wherein the second epitaxial layer comprises a second silicon germanium layer with a second germanium concentration greater than the first germanium concentration, and wherein the second epitaxial layer embeds the plurality of clusters of dopants.

20. The semiconductor structure of claim 19, further comprising a silicide layer formed in the second epitaxial layer, wherein a separation between the silicide layer and the first epitaxial layer is less than about 5 nm.

* * * * *